US012787691B2

(12) United States Patent
Yoshihara et al.

(10) Patent No.: US 12,787,691 B2
(45) Date of Patent: Nov. 3, 2026

(54) CONTROL ASSISTANCE DEVICE AND CONTROL ASSISTANCE METHOD

(71) Applicant: SCREEN HOLDINGS CO., LTD., Kyoto (JP)

(72) Inventors: Koki Yoshihara, Kyoto (JP); Takaaki Seiwa, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 248 days.

(21) Appl. No.: 18/839,682

(22) PCT Filed: Feb. 22, 2023

(86) PCT No.: PCT/JP2023/006489
§ 371 (c)(1),
(2) Date: Aug. 19, 2024

(87) PCT Pub. No.: WO2023/167074
PCT Pub. Date: Sep. 7, 2023

(65) Prior Publication Data
US 2025/0147493 A1 May 8, 2025

(30) Foreign Application Priority Data
Mar. 2, 2022 (JP) ................................ 2022-031944

(51) Int. Cl.
*H10P 72/00* (2026.01)

(52) U.S. Cl.
CPC .............................. *H10P 72/0604* (2026.01); *G05B 2219/41108* (2013.01); *G05B 2219/45031* (2013.01)

(58) Field of Classification Search
CPC ...... H10P 72/0604; G05B 2219/41108; G05B 2219/45031
See application file for complete search history.

(56) References Cited

U.S. PATENT DOCUMENTS

2008/0183340 A1 7/2008 Kofuji et al.
2018/0247798 A1 8/2018 Guha et al.
(Continued)

FOREIGN PATENT DOCUMENTS

CN 111479952 A 7/2020
JP 2000-003206 A 1/2000
(Continued)

OTHER PUBLICATIONS

Limanond, Suttipan, Jennie Si, and Kostas Tsakalis. "Monitoring and control of semiconductor manufacturing processes." IEEE Control Systems Magazine 18.6 (1998): 46-58. (Year: 1998).*
(Continued)

*Primary Examiner* — Michael D Masinick
(74) *Attorney, Agent, or Firm* — OSTROLENK FABER LLP

(57) ABSTRACT

A control assistance device includes a correspondence relationship acquirer that acquires a correspondence relationship between a plurality of model identification information pieces for identification of a plurality of respective determination models that respectively determine normality degrees of operations of the constituent element based on processing information pieces representing operations or states relating to a process executed on a substrate by the substrate processing apparatus, and a plurality of parameter values, an information acquirer that acquires a model identification information piece corresponding to a determination model, among the plurality of determination models, that is configured to obtain a proper determination result based on processing information pieces during an operation of the constituent element, and a determiner that determines the parameter value for control of the constituent element based on the correspondence relationship acquired by the correspondence relationship acquirer and the model identi-
(Continued)

fication information piece acquired by the information acquirer.

11 Claims, 14 Drawing Sheets

(56) References Cited

U.S. PATENT DOCUMENTS

| | | | | |
|---|---|---|---|---|
| 2019/0259674 | A1 | 8/2019 | Howald et al. | |
| 2021/0011468 | A1* | 1/2021 | Terasawa | G05B 19/0426 |
| 2021/0073610 | A1 | 3/2021 | Kuriki et al. | |
| 2021/0134630 | A1* | 5/2021 | Pizzella | G06Q 10/0631 |
| 2021/0264076 | A1* | 8/2021 | Yamamoto | G06F 30/20 |
| 2022/0082949 | A1* | 3/2022 | Hubaux | G03F 1/70 |
| 2022/0114484 | A1 | 4/2022 | Hanada et al. | |
| 2025/0370845 | A1* | 12/2025 | Mori | G05B 19/4063 |

FOREIGN PATENT DOCUMENTS

| | | | |
|---|---|---|---|
| JP | 2006-091937 | A | 4/2006 |
| JP | 2008-187139 | A | 8/2008 |
| JP | 2018-186610 | A | 11/2018 |
| JP | 2021-168364 | A | 10/2021 |
| JP | 2021-190530 | A | 12/2021 |
| JP | 2022-015151 | A | 1/2022 |
| TW | 202129792 | A | 8/2021 |
| TW | 202208996 | A | 3/2022 |
| WO | WO 2018/151215 | A1 | 8/2018 |
| WO | WO 2020/179729 | A1 | 9/2020 |
| WO | WO 2021/059333 | A1 | 4/2021 |

OTHER PUBLICATIONS

Suzuki, Yusuke, et al. “Machine learning approaches for process optimization.” 2018 international symposium on semiconductor manufacturing (ISSM). IEEE, 2018. (Year: 2018).*

Extended European Search Report dated Feb. 4, 2026 in corresponding European Patent Application No. 23763333.4.

Schott, Kevin et al.: “Multiple Model Adaptive Control (MMAC)”, In: “Nonlinear model based process control: [proceedings of the NATO Advanced Study Institute on Nonlinear Model Based Process Control, Antalya, Turkey, Aug. 10-20, 1997]”, Jan. 1, 1998, Springer, Dordrecht, XP093221019, ISBN: 978-94-010-6140-7, pp. 33-57, DOI: 10.1007/978-94-011-5094-1_2, Retrieved from the Internet: URL:https://link.springer.com/chapter/10.1 007/978-94-011-5094-1_2.

Narendra, Kumpati S., et al.: “Adaptive Control Using Multiple Models”, IEEE Transactions on Automatic Control, IEEE, USA, vol. 42, No. 2, Feb. 1, 1997, XP011000311, ISSN: 0018-9286.

International Search Report mailed May 9, 2023 in corresponding PCT International Application No. PCT/JP2023/006489.

Office Action mailed Nov. 6, 2023 in corresponding Taiwanese Application No. 112107212.

* cited by examiner

*FIG.3*

| DEVIATION DEGREE (DIFFERENCE VALUE) | | PROCESSING INFORMATION | | | | |
|---|---|---|---|---|---|---|
| | | a | b | c | d | e |
| PROCESSING INFORMATION | a | | 35 | 1 | 0 | 5 |
| | b | 21 | | 0 | 1 | 0 |
| | c | 0 | 1 | | 31 | 0 |
| | d | 0 | 0 | 61 | | 3 |
| | e | 2 | 0 | 0 | 0 | |

PROCESSING INFORMATION a. FAN ROTATION SPEED OF FFU b. INNER PRESSURE VALUE OF FFU c. CURRENT POSITION OF GAS DISCHARGE CHAMBER d. CHAMBER GAS-EXHAUST PRESSURE VALUE e. SHUTTER OPENING-CLOSING POINT IN TIME

ABNORMALITY SCORE
(SUM OF DEVIATION DEGREES)

161

FIG.6

CR

| DETERMINATION MODEL NUMBER | CONTROL PARAMETER | | | | |
|---|---|---|---|---|---|
| | CONTROL PERIOD | P GAIN | I GAIN | D GAIN | DEAD-ZONE RANGE |
| M1 | 10 | 200 | 20 | 40 | 7 |
| M2 | 15 | 100 | 20 | 40 | 7 |
| ⋮ | ⋮ | | | | |
| Mn | 10 | 150 | 20 | 40 | 7 |

CONTROL ASSISTANCE DEVICE AND CONTROL ASSISTANCE METHOD

CROSS-REFERENCE TO RELATED APPLICATIONS

The present application is a 35 U.S.C. §§ 371 national stage application of International Application No. PCT/JP2023/006489, filed Feb. 22, 2023, which claims priority to Japanese Patent Application No. 2022-031944, filed Mar. 2, 2022, the contents of which are incorporated herein by reference.

TECHNICAL FIELD

The present invention relates to a control assistance device and a control assistance method.

BACKGROUND ART

A substrate processing apparatus that processes a substrate such as a semiconductor substrate (semiconductor wafer) includes a gas supply-exhaust system for maintaining cleanliness of an atmosphere in a chamber in which the substrate is processed. Patent Document 1 describes a configuration for supply of a clean air into a chamber and a configuration for exhaust of air from the chamber. Generally, the inside of the chamber of the substrate processing apparatus is maintained at a constant pressure in order to prevent particles from scattering. Patent Document 2 describes an exhaust duct including an FFU (fan filter unit) provided at an air outlet port of the chamber and an exhaust valve. In the substrate processing apparatus, the constituent elements (components or appliances) of the gas supply-exhaust system are controlled, so that the pressure in the chamber is maintained constant.

[Patent Document 1] JP 2021-190530 A

[Patent Document 2] JP 2022-015151 A

SUMMARY OF INVENTION

Technical Problem

Generally, even constituent elements of the same type have different characteristics due to individual differences. Therefore, in order to normally operate the gas supply-exhaust system, it is necessary to determine the values of control parameters for control of the respective constituent elements. An engineer determines the value of a control parameter for each constituent element. In this case, in order to determine the value of a control parameter, the engineer needs to repeatedly and finely adjust the value of the control parameter for each constituent element and for each processing recipe (processing procedure) using a teaching operation of the substrate processing apparatus. These are extremely time-consuming work.

An object of the present invention is to provide a control assistance device and a control assistance method that enable reduction of labor for determining a value of a control parameter of a constituent element of a gas supply-exhaust system of a substrate processing apparatus.

Solution to Problem (1) A control assistance device according to one aspect of the present invention that determines a parameter value which is a value of a control parameter for control of a constituent element in a gas supply-exhaust system of a substrate processing apparatus, includes a correspondence relationship acquirer that acquires a correspondence relationship between a plurality of model identification information pieces for identification of a plurality of respective determination models that respectively determine normality degrees of operations of the constituent element based on processing information pieces representing operations or states relating to a process executed on a substrate by the substrate processing apparatus, and a plurality of parameter values, an information acquirer that acquires a model identification information piece corresponding to a determination model, among the plurality of determination models, that is configured to obtain a proper determination result based on processing information pieces during an operation of the constituent element, and a determiner that determines the parameter value for control of the constituent element based on the correspondence relationship acquired by the correspondence relationship acquirer and the model identification information piece acquired by the information acquirer.

With the control assistance device, a constituent element in the gas supply-exhaust system of the substrate processing apparatus is controlled based on a parameter value. At this time, the normality degree of the constituent element is determined by the plurality of determination models based on the processing information piece of the substrate processing apparatus. The plurality of model identification information pieces and the plurality of parameter values are associated with each other in advance. The correspondence relationship between the plurality of model identification information pieces and the plurality of parameter values is acquired by the correspondence relationship acquirer. Further, the model identification information piece corresponding to the determination model capable of obtaining a proper determination result based on the processing information piece during the operation of the constituent element among the plurality of determination models is acquired. In this case, it is possible to determine the determination model capable of obtaining the proper determination result based on the model identification information piece. Further, the parameter value corresponding to the determined determination model can be determined based on the correspondence relationship. Thus, the parameter value is determined based on the obtained correspondence relationship and the obtained model identification information piece. Therefore, an appropriate parameter value for control of the constituent element in the gas supply-exhaust system of the substrate processing apparatus is automatically determined. As a result, it is possible to reduce the labor for determining the appropriate value of the control parameter of the constituent element in the gas supply-exhaust system of the substrate processing apparatus.

(2) The information acquirer may acquire a model identification information piece of a determination model corresponding to a determination result indicating a highest normality degree among a plurality of determination results of the plurality of determination models.

In this case, a normality degree is determined by the plurality of determination models based on the processing information piece during the operation of the appliance in the gas supply-exhaust system, and the model identification information piece corresponding to the determination model corresponding to the determination result indicating the highest normality degree is acquired. Thus, it is possible to determine, in a short period of time, an appropriate parameter value with which the determination result indicating the highest normality degree can be obtained. Therefore, a worker does not need to finely adjust a parameter value.

(3) The substrate processing apparatus may include a plurality of constituent elements of a same type as the constituent elements, the plurality of parameter values may be respective values for control of the plurality of respective constituent elements, and the determiner may determine the parameter value for control of each constituent element based on the correspondence relationship acquired by the correspondence relationship acquirer and the model identification information piece acquired by the information acquirer.

In this case, in a case in which the parameter value corresponding to each appliance is determined, a parameter value corresponding to another appliance can be determined as a parameter value corresponding to the above-mentioned one appliance. Therefore, the parameter values of the plurality of appliances can be easily determined.

(4) The control assistance device may further include a transmitter that transmits the parameter value determined by the determiner to the substrate processing apparatus.

In this case, a parameter value to be used for control of an appliance in the gas supply-exhaust system of the substrate processing apparatus is transmitted to the substrate processing apparatus. Therefore, it is possible to automatically set a parameter value for control of the appliance in the gas supply-exhaust system of the substrate processing apparatus in the substrate processing apparatus.

(5) The determiner, when the substrate processing apparatus is installed, when the substrate processing apparatus is inspected, or in a case in which a constituent element of the substrate processing apparatus is replaced with a new constituent element, may determine the parameter value used for control of a constituent element after the installation or after the replacement.

In this case, when the substrate processing apparatus is installed, when the substrate processing apparatus is inspected or when an appliance is replaced, an appropriate parameter value used for the appliance after installation or after replacement can be determined automatically and in a short period of time.

(6) During a normal operation of the substrate processing apparatus, in a case in which a determination result of a determination model corresponding to the parameter value used for control of the constituent element indicates a predetermined abnormality state, the correspondence relationship acquirer may acquire the correspondence relationship, the information acquirer may acquire a model identification information piece corresponding to a determination model capable of obtaining the proper determination result, and the determiner, based on the correspondence relationship acquired by the correspondence relationship acquirer and the model identification information piece acquired by the information acquirer, may determine the parameter value to be newly used for control of the constituent element.

In a case in which a parameter value used for control of the appliance is no longer appropriate due to a change over time in characteristics of the appliance in the gas supply-exhaust system of the substrate processing apparatus, the determination result of the determination model corresponding to the parameter value may indicate an abnormal state. In such a case, it is possible to determine, automatically and in a short period of time, a parameter value to be newly used for control of the appliance. As a result, the appliance can be continuously used.

(7) Each of the plurality of determination models, based on invariant relationships in regard to the plurality of processing information pieces representing operations or states relating to a process executed on a substrate by the substrate processing apparatus and a plurality of processing information pieces that have been actually collected from the substrate processing apparatus, may determine a normality degree of the constituent element.

In this case, the normality degree of the operation of the appliance is appropriately determined based on the invariant relationship between the processing information pieces of the substrate processing apparatus. Thus, the acquired model identification information piece indicates a determination model capable of obtaining a more proper determination result. Therefore, it is possible to determine a more appropriate parameter value used for control of the appliance.

(8) The control assistance device may further include a storage that stores the correspondence relationship, wherein the correspondence relationship acquirer may acquire the correspondence relationship stored by the storage, and the determiner may determine the parameter value for control of the constituent element using the correspondence relationship stored in the correspondence relationship acquirer.

In this case, after determination of parameter value, a plurality of correspondence relationships are stored. Thus, it is no longer necessary to provide a configuration for storage of correspondence relationships outside of the control assistance device.

(9) The substrate processing apparatus may include a chamber in which a process is executed on a substrate, the constituent element may include a gas supplier that supplies gas to the chamber, and a gas exhauster that exhausts gas from the chamber, and the parameter value may be a value relating to an operation of one of the gas supplier and the gas exhauster.

In this case, it is possible to determine, in a short period of time, an appropriate parameter value relating to at least one of the supply of gas into the chamber and the exhaust of gas from the chamber of the substrate processing apparatus. Thus, it is possible to accurately execute the control of an airflow in the chamber.

(10) The control parameter may include a first parameter corresponding to the gas supplier and a second parameter corresponding to a gas exhauster, a parameter value of the first parameter may be a value relating to an operation of the gas supplier, and a parameter value of the second parameter may be a value relating to an operation of the gas exhauster.

In this case, it is possible to determine, in a short period of time, an appropriate parameter value of at least one of the first and second parameters relating to the supply of gas into the chamber and the exhaust of gas from the chamber of the substrate processing apparatus. Thus, it is possible to accurately execute control of supply of gas into chamber and exhaust of gas from the chamber.

(11) A control assistance method according to another aspect of the present invention of determining a parameter value which is a value of a control parameter for control of a constituent element in a gas supply-exhaust system of a substrate processing apparatus, includes acquiring a correspondence relationship between a plurality of model identification information pieces for identification of a plurality of respective determination models that respectively determine normality degrees of operations of the constituent element based on processing information pieces representing operations or states relating to a process executed on a substrate by the substrate processing apparatus, and a plurality of parameter values, acquiring a model identification information piece corresponding to a determination model, among the plurality of determination models, that is configured to obtain a proper determination result based on processing information pieces during an operation of the constituent element, and determining the parameter value for control of the constituent element based on the acquired correspondence relationship and the acquired model identification information piece.

With the control assistance method, it is possible to determine a determination model capable of obtaining a proper determination result based on a model identification information piece. Further, the parameter value corresponding to the determined determination model can be determined based on the correspondence relationship. Thus, a parameter value is determined based on an obtained correspondence relationship and an obtained model identification information piece. Therefore, an appropriate parameter value for control of an appliance in the gas supply-exhaust system of the substrate processing apparatus is automatically determined. As a result, it is possible to reduce the labor for determination of an appropriate value of a control parameter of a constituent element in the gas supply-exhaust system of the substrate processing apparatus.

Advantageous Effects of Invention

With the present invention, it is possible to reduce the labor for determination of a value of a control parameter of a constituent element of a gas supply-exhaust system of a substrate processing apparatus.

BRIEF DESCRIPTION OF THE DRAWINGS

FIG. 3 is a diagram for explaining the specific example of calculation of an abnormality score.

FIG. 6 is a conceptual diagram for explaining the correspondence relationships between a determination model number and a parameter value.

DESCRIPTION OF EMBODIMENTS

A substrate assistance device and a substrate assistance method according to one embodiment of the present invention will be described below in detail with reference to the drawings. In the following description, a substrate refers to a semiconductor substrate (semiconductor wafer), a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like.

(1) Overall Configuration

Figure 1:
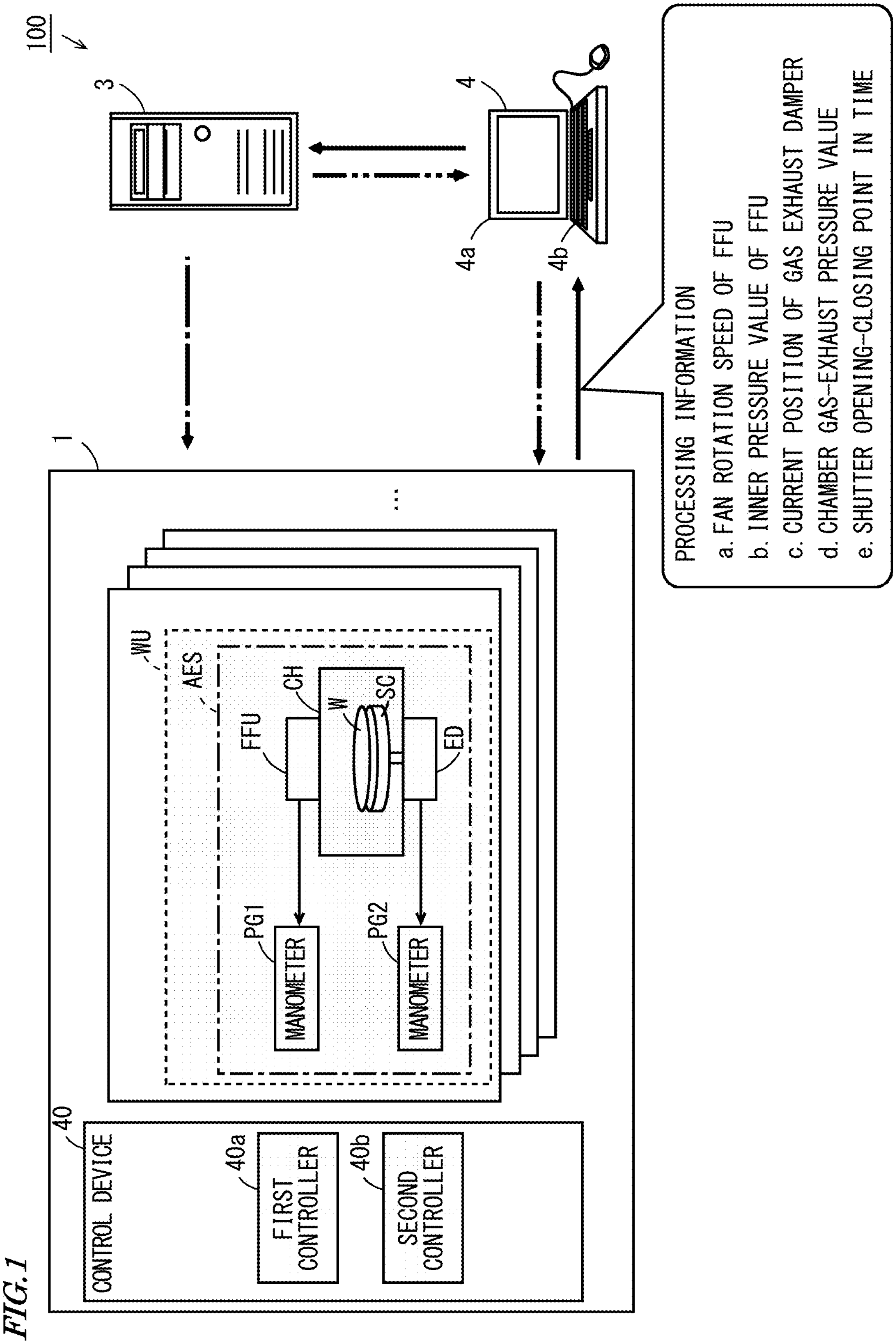
FIG. 1 is a diagram for explaining the configuration of a substrate processing system including a control assistance device according to one embodiment.

FIG. 1 is a block diagram for explaining the configuration of a substrate processing system including the control assistance device according to the one embodiment. The substrate processing system 100 of FIG. 1 includes a substrate processing apparatus 1, an information analysis device 3 and a control assistance device 4. The control assistance device 4 is connected to the substrate processing apparatus 1 and the information analysis device 3. The control assistance device 4 is connected to each of the substrate processing apparatus 1 and the information analysis device 3 by a wired or wireless communication path or a wired or wireless communication network. For example, the control assistance device 4 is connected to each of the substrate processing apparatus 1 and the information analysis device 3 by a communication network such as the Internet. In the present embodiment, the control assistance device 4 is connected to each of the substrate processing apparatus 1 and the information analysis device 3 by a wired or wireless LAN (Local Area Network).

(2) Example of Configuration of Substrate Processing Apparatus 1

In the example of FIG. 1, the substrate processing apparatus 1 includes a control device 40 and a plurality of substrate processing units WU. Each substrate processing unit WU has a spin chuck SC for holding and rotating a substrate W, and a chamber CH. The chamber CH has an opening through which the substrate W can pass, and has a shutter (not shown) for opening and closing the opening. The substrate processing unit WU includes a substrate cleaning unit, a photosensitive film formation unit, a peripheral edge exposure unit, a development unit and the like, for example. The substrate processing apparatus 1 includes various constituent elements (appliances, components or the like) constituting the substrate processing apparatus 1. For example, the substrate processing apparatus 1 includes a gas supply-exhaust system AES for maintaining cleanliness of an atmosphere in the chamber CH of each substrate processing unit WU. In the chamber CH, various processes are executed on the substrate W held by the spin chuck SC. For example, the substrate W is cleaned when a cleaning liquid is supplied to the substrate W. The gas supply-exhaust system AES includes a gas supplier FFU, a gas exhauster ED and manometers PG1, PG2 as constituent elements. The control device 40 includes a first controller 40*a* for controlling the plurality of gas suppliers FFU and a second controller 40*b* for controlling the plurality of gas exhausters ED. In the substrate processing apparatus 1, a display device, a speech output device and an operation unit (not shown) are provided in addition to the plurality of above-mentioned constituent elements. The substrate processing apparatus 1 is operated in accordance with a predetermined processing procedure (processing recipe) of the substrate processing apparatus 1.

The gas supplier FFU is provided at a gas supply port of the chamber CH in order to supply a clean gas (air or an inert gas, for example) into the chamber CH. The gas supplier FFU is a fan filter unit including a fan motor, for example. In the gas supplier FFU, a rotation speed of the fan motor is adjusted. Thus, a flow rate of gas supplied into the chamber CH is adjusted. The gas exhauster ED is provided at a gas exhaust port of the chamber CH in order to exhaust gas from the chamber CH. The gas exhauster ED includes a gas exhaust damper including a damper motor, for example. In the gas exhauster ED, an opening of the gas exhaust damper is adjusted by the damper motor. Thus, a flow rate of gas exhausted from the chamber CH is adjusted. The manometer PG1 measures a pressure of a gas supplied to the chamber CH (hereinafter referred to as a first control pressure). The manometer PG2 measures a pressure of gas exhausted from the chamber CH (hereinafter referred to as a second control pressure).

Here, it is necessary that the chamber CH is maintained at a constant pressure in order to prevent scattering of particles due to turbulence in the chamber CH. As such, the first controller 40*a* of the control device 40 controls the gas supplier FFU in order to set a value of the first control pressure to a predetermined pressure value (hereinafter referred to as a first target pressure value). Further, the second controller 40*b* of the control device 40 controls the gas exhauster ED in order to set a value of the second control pressure to a predetermined pressure value (hereinafter referred to as a second target pressure value).

In the present embodiment, the first controller 40*a* performs PID (Proportional-Integral-Derivative) control of electric power supplied to the fan motor of the gas supplier FFU based on the difference between the first control pressure and the first target pressure value in order to maintain a constant pressure of gas supplied into the chamber CH. Thus, the pressure of gas supplied into the chamber CH is maintained constant. Further, the second controller 40*b* performs PID (Proportional-Integral-Derivative) control of electric power supplied to the damper motor of the gas exhauster ED based on the difference between the second control pressure and the second target pressure value in order to maintain a constant pressure of gas exhausted from the chamber CH. Thus, the pressure of gas exhausted from the chamber CH is maintained constant. The pressure in the chamber CH is maintained constant by the above-mentioned control performed by the first controller 40*a* and the second controller 40*b*. In the substrate processing apparatus 1 of FIG. 1, a plurality of gas suppliers FFU of the same type and a plurality of gas exhausters ED of the same type are provided to correspond to the plurality of substrate processing units WU.

Here, in a case in which the control device 40 controls the constituent elements of the substrate processing apparatus 1, the constituent elements are controlled using values of various control parameters. The control device 40 controls the operation of each constituent element by using a control parameter defined for each type of the constituent element. In this case, even the constituent elements of the same type have different characteristics due to individual differences. Therefore, appropriate values of control parameters are respectively set for the plurality of constituent elements of the same type. Hereinafter, a value of a control parameter is referred to as a parameter value.

For example, in the gas supplier FFU of FIG. 1, individual differences are generated in regard to an installation position of the chamber CH, responsiveness of the fan of the gas supplier FFU, an actual rotation speed of the fan with respect to an operation amount of the gas supplier FFU (a rotation speed designated by a control signal), and the like. Thus, the gas suppliers FFU and the gas exhausters ED of the substrate processing apparatus 1 respectively have different characteristics. Therefore, it is necessary to set an appropriate parameter value for each constituent element. In the example of FIG. 1, the control parameters used for control of the gas supplier FFU and the gas exhauster ED are a P gain, an I gain, a D gain, a control period, a dead-zone range and the like.

(3) Processing Information

In the substrate processing apparatus 1, as information for management of an abnormality of a constituent element of the substrate processing apparatus 1, a plurality of processing information pieces representing the operations or states relating to a process for the substrate W in the substrate processing apparatus 1 are defined. In the present embodiment, as indicated by the thick arrow in FIG. 1, these processing information pieces are transmitted from the control device 40 of the substrate processing apparatus 1 to the information analysis device 3 through the control assistance device 4 in a predetermined period.

In the example of FIG. 1, as shown in the balloon, the processing information pieces transmitted from the substrate processing apparatus 1 to the information analysis device 3 through the control assistance device 4 include "a. FAN ROTATION SPEED OF FFU," "b. INNER PRESSURE VALUE OF FFU," "c. CURRENT POSITION OF GAS EXHAUST DAMPER," "d. CHAMBER GAS-EXHAUST PRESSURE VALUE" and "e. SHUTTER OPENING-CLOSING POINT IN TIME." In this manner, in the present example, the processing information pieces, relating to the gas suppliers FFU and the gas exhausters ED which are the constituent elements, are shown.

"a. FAN ROTATION SPEED OF FFU" indicates a rotation speed of the fan of the gas supplier FFU. "b. INNER PRESSURE VALUE OF FFU" is a value of the pressure in the gas supplier FFU. "c. CURRENT POSITION OF GAS EXHAUST DAMPER" is a value indicating an opening of the damper of the gas exhauster ED. "d. CHAMBER GAS-EXHAUST PRESSURE VALUE" is a value of the pressure of gas exhausted from the gas exhauster ED. "e. SHUTTER OPENING-CLOSING POINT IN TIME" is a value indicating an opening-closing point in time of the shutter provided in the chamber CH.

(4) Abnormality Detection (Normality Degree Detection) of Each Constituent Element by Information Analysis Device 3

The information analysis device 3 is a server, for example, and includes a CPU (Central Processing Unit) and a memory. The information analysis device 3 collects a plurality of processing information pieces transmitted from the substrate processing apparatus 1. In the information analysis device 3, in regard to the plurality of processing information pieces transmitted from the substrate processing apparatus 1 to the information analysis device 3, a plurality of combinations each combination of which includes two different processing information pieces are predetermined.

At this time, a predetermined invariant relationship (hereinafter referred to as an invariant relationship) between two processing information pieces that form each combination is maintained. The invariant relationship is set for each predetermined processing procedure (processing recipe) of the substrate processing apparatus 1.

Here, suppose that an inappropriate substrate process is executed because a substrate process is executed with an abnormality present in any constituent element of the substrate processing apparatus 1. In this case, the relationship between two processing information pieces forming at least one combination of the plurality of combinations deviates from the invariant relationship.

The information analysis device 3 calculates a plurality of deviation degrees in regard to a plurality of processing information pieces. A deviation degree indicates a degree of deviation from the predetermined invariant relationship between two processing information pieces to the relationship between two actually collected processing information pieces in regard to the two processing information pieces. Further, the information analysis device 3 calculates an abnormality degree of a constituent element as an abnormality score based on the plurality of calculated deviation degrees. The abnormality score represents the normality degree of the operation of a constituent element. That is, in a case in which the abnormality score is low, the normality degree of the operation of a constituent element is high. In a case in which the abnormality score is high, the normality degree of the operation of a constituent element is low. A specific example of a method of calculating an abnormality score will be described below.

Further, an abnormality score changes depending on a parameter value set for each constituent element. In a case in which a parameter value set for each constituent element is appropriate, the normality degree of the operation of the constituent element is high, and the abnormality score is low. Conversely, in a case in which a parameter value set for each constituent element is not appropriate, the normality degree of the operation of the constituent element is low, and the abnormality score is high. As described below, in the present embodiment, an appropriate parameter value can be determined using an abnormality score.

(5) Example of Calculation of Abnormality Score by Information Analysis Device 3

Figure 2:
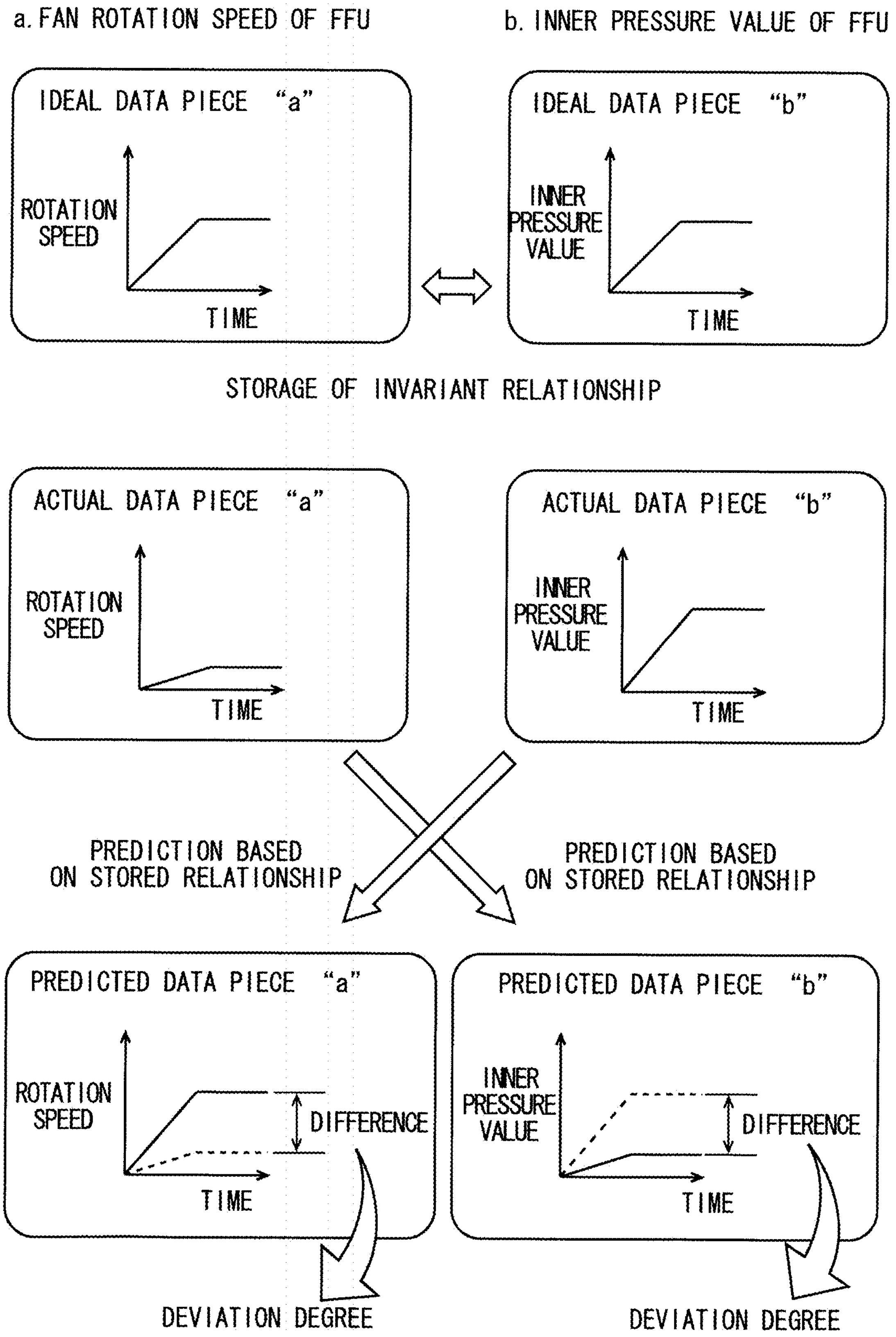
FIG. 2 is a diagram for explaining the specific example of calculation of deviation degrees.

As described above, in the information analysis device 3, a plurality of combinations each of which includes two different processing information pieces are defined. In order to calculate an abnormality score of a constituent element, a deviation degree is calculated for each combination. FIG. 2 is a diagram for explaining the specific example of calculation of a deviation degree. Here, an example of calculation of a deviation degree corresponding to the combination of "a. FAN ROTATION SPEED OF FFU" and "b. INNER PRESSURE VALUE OF FFU" of FIG. 1 is described. In the following description, the data of "a. FUN ROTATION SPEED OF FFU" is suitably referred to as a data piece "a," and the data of "b. INNER PRESSURE VALUE OF FFU" is suitably referred to as a data piece "b."

In order to calculate a deviation degree, reference data based on the invariant relationship between "a. FAN ROTATION SPEED OF FFU" and "b. INNER PRESSURE VALUE OF FFU" is required. As such, the information analysis device 3 holds the data piece "a" and the data piece "b" when the constituent element (the gas supplier FFU in the present example) of the gas supply-exhaust system of the substrate processing apparatus 1 is ideally operating in accordance with a predetermined processing recipe before the process is actually executed on the substrate W in the substrate processing apparatus 1.

These ideal data piece "a" and ideal data piece "b" are acquired based on a plurality of processing information pieces transmitted from the substrate processing apparatus 1 when the substrate processing apparatus 1 is operating actually and normally, for example. Alternatively, the ideal data piece "a" and the ideal data piece "b" may be generated by simulation or the like.

One example of the temporal changes of the ideal data piece "a" and the ideal data piece "b" is shown by the graphs in the upper portion of FIG. 2. In the graph for the data piece "a," the abscissa indicates time, and the ordinate indicates a value of the rotation speed of the fan of the gas supplier FFU. In the graph for the data piece "b," the abscissa indicates time, and the ordinate indicates an inner pressure value of the gas supplier FFU. The abscissa (time axis) is common between the graph for the data piece "a" and the graph for the data piece "b."

According to the two graphs in the upper portion of FIG. 2, it is found that the inner pressure value of the gas supplier FFU increases at a substantially constant rate as the value of the rotation speed of the fan of the gas supplier FFU increases. That is, the rotation speed of the fan of the gas supplier FFU and the inner pressure value of the gas supplier FFU have an invariant relationship. In a case in which the substrate processing apparatus 1 operates ideally, the relationship in each combination of the plurality of processing information pieces is equal to the invariant relationship.

In the information analysis device 3, an invariant relationship is created for each combination of the plurality of processing information pieces (the above-mentioned data pieces "a" to "e.") In the present embodiment, an invariant relationship is created for each constituent element of the gas supply-exhaust system of the substrate processing apparatus 1 (FIG. 1).

In this state, the process is executed on the substrate W in the substrate processing apparatus 1, and an actual data piece "a" and an actual data piece "b" are collected by the information analysis device 3. One example of the temporal changes of the actually collected data piece "a" and the actually collected data piece "b" is shown by the graphs in the center portion of FIG. 2.

When the actual data piece "a" is collected, the data piece "b" is predicted based on the pre-stored invariant relationship. Further, when the actual data piece "b" is collected, the data piece "a" is predicted based on the pre-stored invariant relationship. One example of the temporal changes of the data piece "a" and the data piece "b" that are predicted based on the invariant relationship is shown by the graphs in the lower portion of FIG. 2. In the graph in the lower portion of FIG. 2, the predicted data piece "a" and the predicted data piece "b" are indicated by the solid lines, and the actually collected data piece "a" and the actually collected data piece "b" are indicated by the dotted lines.

In a case in which the gas supplier FFU is ideally operating, the actual data piece "a" and the predicted data piece "a" coincide or substantially coincide with each other. Further, the actual data piece "b" and the predicted data piece "b" coincide or substantially coincide with each other. However, in a case in which an abnormality is present in the gas supplier FFU, the actual data piece "a" and the predicted data piece "a" are likely to deviate from each other. Further, the actual data piece "b" and the predicted data piece "b" are likely to deviate from each other. It is considered that, the larger a degree of abnormality that occurs in the gas supplier FFU, the larger a deviation degree, and the smaller a degree of abnormality that occurs in the gas supplier FFU, the smaller a deviation degree.

As such, in the present embodiment, the difference value between the data which is actually collected processing information and the data which is predicted processing information is calculated as a deviation degree. In the example of FIG. 2, the information analysis device 3 calculates the difference value between the actual data piece "a" and the predicted data piece "a" as a deviation degree when calculating a deviation degree at a certain point in time. Further, the information analysis device 3 calculates the difference value between the actual data piece "b" and the predicted data piece "b" as a deviation degree.

FIG. 3 is a diagram for explaining the specific example of calculation of an abnormality score. The information analysis device 3 calculates the above-mentioned deviation degrees for all combinations in regard to the plurality of processing information pieces. Each of the plurality of values arranged in the row at the right of each of the processing information pieces "a" to "e" in the left column of FIG. 3 represents the deviation degree between a processing information piece predicted based on each of the processing information pieces "a" to "e" in the upper row, and an actually acquired processing information piece. Each of the plurality of values arranged in the column below each of the processing information pieces "a" to "e" in the upper row of FIG. 3 represents the deviation degree between a processing information piece predicted based on each of the processing information pieces "a" to "e" in the left column, and an actually acquired processing information piece.

For example, the value "35" at the intersection of the row for the processing information piece "a" in the left column and the column for the processing information piece "b" in the upper row represents the deviation degree between the processing information piece "a" that is predicted based on the processing information piece "b" and the actually acquired processing information piece "a." Further, the value "21" at the intersection of the row for the processing information piece "b" in the left column and the column for the processing information piece "a" in the upper row represents the deviation degree between the processing information piece "b" that is predicted based on the processing information piece "a" and the actually acquired processing information piece "b."

FIG. 3 shows the plurality of deviation degrees calculated in regard to all combinations of the plurality of processing information pieces related to one constituent element. When all of the deviation degrees are calculated, the information analysis device 3 calculates the sum of the plurality of calculated deviation degrees as an abnormality score corresponding to the constituent element. In the example of FIG. 3, the abnormality score is 161.

In the present embodiment, in the information analysis device 3, as described above, based on the deviation degree between a predicted processing information piece and an actually acquired processing information piece in regard to a plurality of processing information pieces relating to each constituent element, a determination model for determining a normality degree of the operation of the constituent element is generated and updated by machine learning. Thus, in the information analysis device 3, a plurality of determination models are generated and updated in correspondence with a plurality of constituent elements (a plurality of gas suppliers FFU, for example) of the same type in the substrate processing apparatus 1. In the present embodiment, the determination result of a normality degree in regard to the operation of a constituent element corresponding to each determination model is calculated as an abnormality score.

In the present embodiment, a parameter value to be set for one or a plurality of constituent elements is determined based on abnormality scores calculated by a plurality of determination models. Hereinafter, an operation of generating a plurality of determination models by machine learning is referred to as a training operation. Further, an operation of updating (finely adjusting) a parameter value set for each constituent element is referred to as a proper parameter value updating operation.

(6) Training Operation

Figure 4:
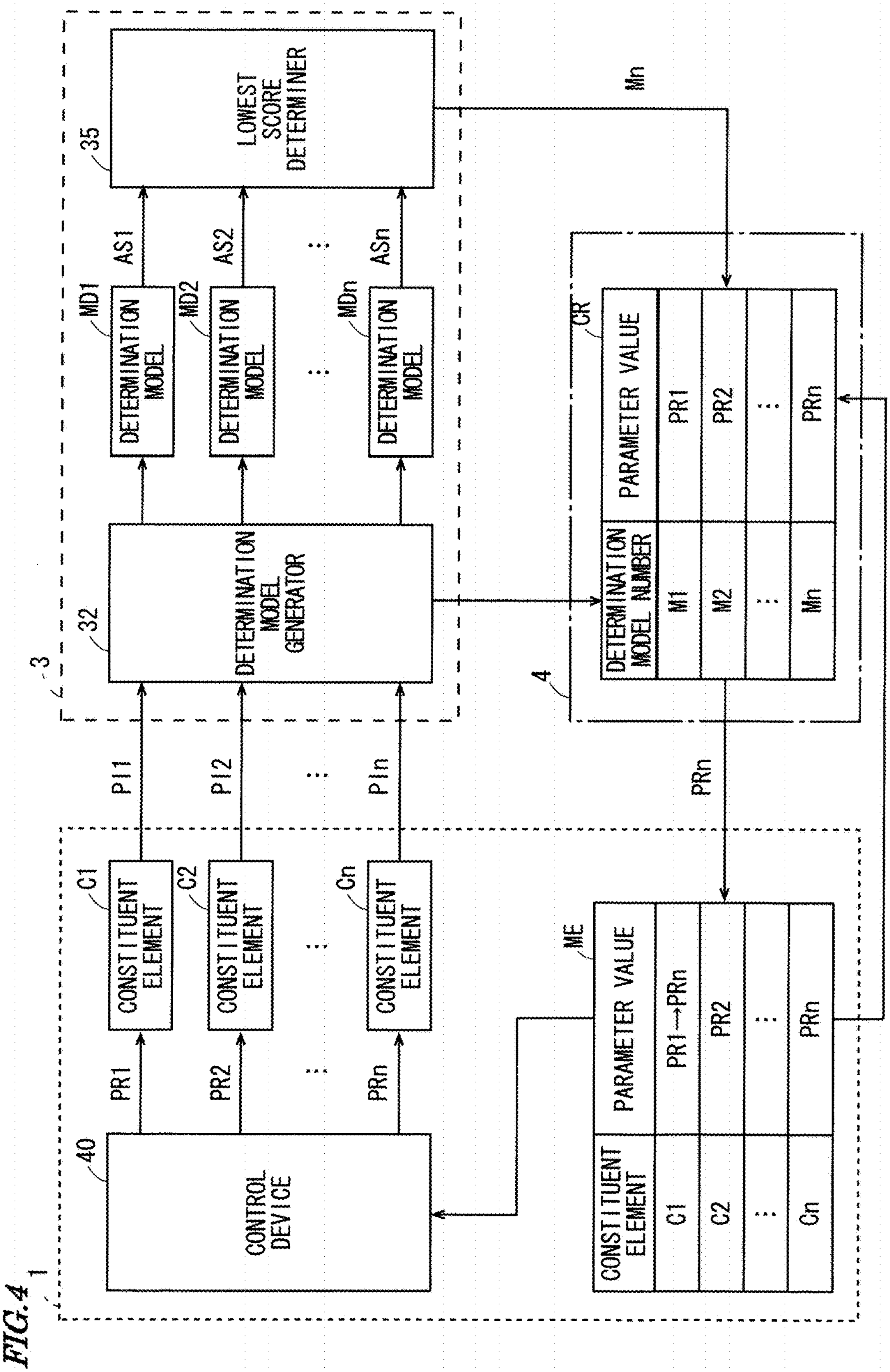
FIG. 4 is a conceptual diagram for explaining the operation of a substrate processing apparatus, an information analysis device and a control assistance device in a training operation and a proper parameter value updating operation.
Figure 5:
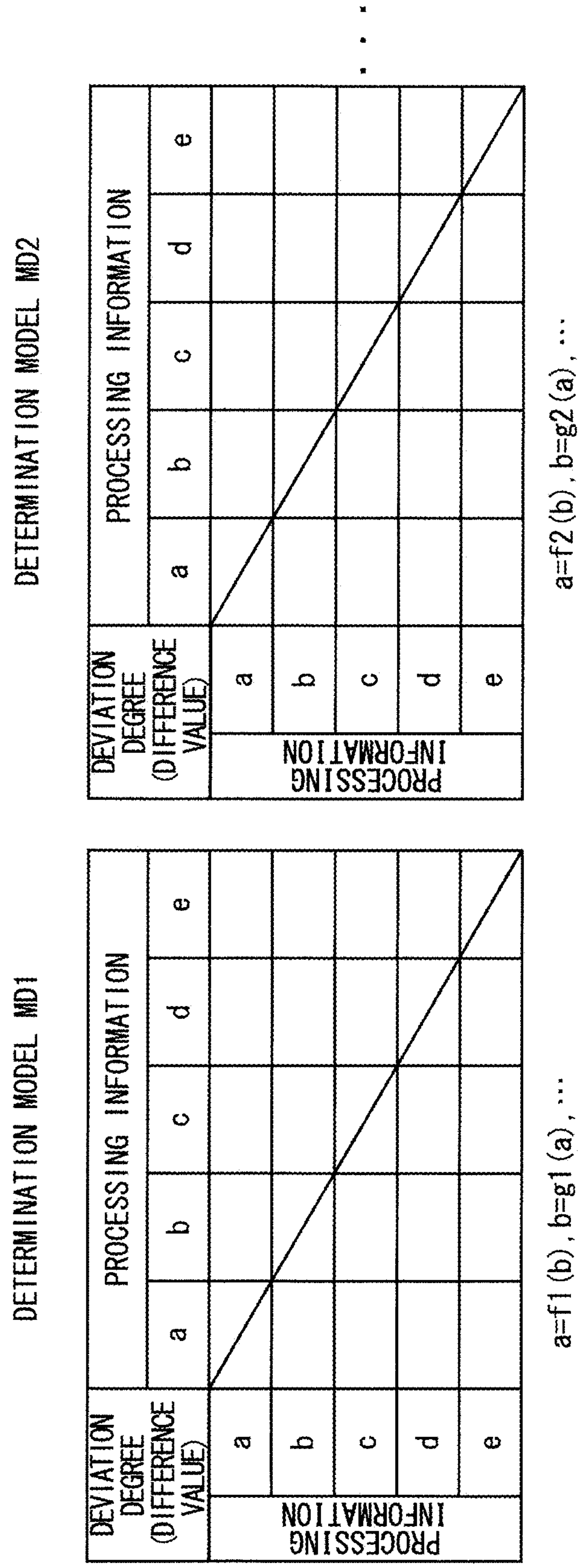
FIG. 5 is a conceptual diagram for explaining a plurality of determination models.

FIG. 4 is a conceptual diagram for explaining the operations of the substrate processing apparatus 1, the information analysis device 3 and the control assistance device 4 in the training operation and the proper parameter value updating operation. FIG. 5 is a conceptual diagram for explaining a plurality of determination models. FIG. 6 is a conceptual diagram for explaining the correspondence relationship between a determination model number and a parameter value.

In the example of FIG. 4, parameter values PR1, PR2, . . . , PRn of the plurality of constituent elements C1, C2, . . . , Cn of the same type in the substrate processing apparatus 1 are set in a storage ME. Here, n is an integer that is equal to or larger than 2.

When an instruction for starting the training operation is provided, the control device 40 of the substrate processing apparatus 1 controls the operations of the plurality of constituent elements C1 to Cn based on the parameter values PR1 to PRn set in the storage ME. Thus, the plurality of processing information pieces PI1, PI2, . . . , PIn respectively corresponding to the plurality of constituent elements C1 to Cn are transmitted from the substrate processing apparatus 1 to the information analysis device 3. Each of the plurality of processing information pieces PI1 to PIn includes one or a plurality of processing information pieces. For example, in a case in which the plurality of constituent elements C1 to Cn are a plurality of gas suppliers FFU, the plurality of processing information pieces "a" to "e" corresponding to each gas supplier FFU are transmitted to the information analysis device 3.

The determination model generator 32 of the information analysis device 3 generates a plurality of determination models MD1, MD2, . . . , MDn respectively corresponding to the plurality of constituent elements C1 to Cn using machine learning based on the plurality of received processing information pieces PI1 to PIn. For example, the determination models MD1 to MDn respectively corresponding to the plurality of gas suppliers FFU of FIG. 1 are generated. In the present embodiment, determination model numbers M1 to Mn are assigned to the plurality of determination models MD1 to MDn as model identification information pieces for identification of the respective determination models.

FIG. 5 shows an example of the two determination models MD1, MD2. The determination models MD1, MD2 have different functions representing the relationship between the change of each processing information piece and the change of another processing information piece. For example, in regard to the determination model MD1, the processing information piece "a" is expressed by a function f1 having the processing information piece "b" as a variable. Further, the processing information piece "b" is expressed by a function g1 having the processing information piece "a" as a variable. On the other hand, in regard to the determination model MD2, the processing information piece "a" is expressed by a function f2 having the processing information piece "b" as a variable. Further, the processing information "b" is expressed by a function g2 having the processing information piece "a" as a variable.

As shown in FIG. 4, the substrate processing apparatus 1 transmits the plurality of parameter values PR1 to PRn corresponding to the plurality of constituent elements C1 to Cn to the control assistance device 4, and the information analysis device 3 transmits the plurality of determination model numbers M1 to Mn corresponding to the plurality of determination models MD1 to MDn of the information analysis device 3 to the control assistance device 4. Thus, in the control assistance device 4, the correspondence relationship CR between the plurality of determination model numbers M1 to Mn and the plurality of parameter values PR1 to PRn is stored.

FIG. 6 shows a correspondence relationship CR in regard to one gas supplier FFU of FIG. 1. In the example of FIG. 6, the control parameters include a control period, a P gain, an I gain, a D gain and a dead-zone range. In the correspondence relationship CR of FIG. 6, the plurality of determination model numbers M1 to Mn are associated with a value of the control period, a value of the P gain, a value of the I gain, a value of the D gain and a value of the dead-zone range.

In this manner, in the training operation, the plurality of determination models MD1 to MDn corresponding to the plurality of constituent elements C1 to Cn are generated, and the correspondence relationship CR between the plurality of determination model numbers M1 to Mn and the plurality of parameter values is set.

During a normal operation of the substrate processing apparatus 1, the control device 40 controls the operations of the plurality of constituent elements C1 to Cn based on the parameter values PR1 to PRn set in the storage ME. Thus, the plurality of processing information pieces PI1 to PIn respectively corresponding to the plurality of constituent elements C1 to Cn are transmitted from the substrate processing apparatus 1 to the information analysis device 3.

The information analysis device 3 determines the normality degrees of the constituent elements C1 to Cn corresponding to the plurality of determination models MD1, ME2, . . . , MDn generated by the training operation, and calculates the abnormality scores AS1 to ASn as determination results. The abnormality scores AS1 to ASn corresponding to the plurality of constituent elements C1 to Cn may be transmitted to the substrate processing apparatus 1 or the control assistance device 4. Thus, a worker can identify whether each of the constituent elements C1 to Cn of the substrate processing apparatus 1 is normal or abnormal.

(7) Proper Parameter Value Updating Operation

Here, the constituent elements C1 to Cn of the same type in the substrate processing apparatus 1 have different characteristics due to individual differences. Therefore, at the time of installation (setup) of the substrate processing apparatus 1 in a factory or the like, it is necessary to set respective appropriate parameter values for the respective constituent elements C1 to Cn. In an initial state, predetermined a predetermined parameter value is set for each of the constituent elements C1 to Cn of the substrate processing apparatus 1, for example. In this state, it is necessary to update the parameter value corresponding to each of the constituent elements C1 to Cn to an appropriate parameter value (hereinafter referred to as a proper parameter value). Further, the characteristics of any of the plurality of constituent elements C1 to Cn of the substrate processing apparatus 1 may deteriorate due to a change over time. In this case, the constituent element the characteristics of which have deteriorated is replaced with a new constituent element. Due to the individual difference between a constituent element before replacement and a constituent element after replacement, the characteristics of the constituent element after replacement may differ from the characteristics of the constituent element before replacement. Also in this case, it is necessary to update (finely adjust) a parameter value corresponding to the constituent element before replacement to a parameter value appropriate for the constituent element after replacement.

In the present operation example, the parameter value PR1 for control of the constituent element C1 among the constituent elements C1 to Cn of the substrate processing apparatus 1 is updated (finely adjusted) to an appropriate parameter value, by way of example. This proper parameter value updating operation is performed when the substrate processing apparatus 1 is installed, when the substrate processing apparatus 1 is inspected or when any of the constituent elements C1 to Cn is replaced.

In the proper parameter value updating operation, the control device 40 of the substrate processing apparatus 1 first controls the constituent element C1 using the parameter value PR1 already set for the constituent element C1. Thus, the processing information piece PI1 relating to the constituent element C1 is transmitted from the substrate processing apparatus 1 to the information analysis device 3.

In the information analysis device 3, the processing information piece PI1 relating to the constituent element C1 is provided to the plurality of determination models MD1 to MDn. The plurality of determination models MD1 to MDn calculate the abnormality scores AS1 to ASn as determination results, respectively, based on the processing information piece PI1 using the method described with reference to FIGS. 2 and 3.

The lowest score determiner 35 determines the abnormality score having the lowest value among the abnormality scores AS1 to ASn calculated by the plurality of determination models MD1 to MDn, and transmits the determination model number corresponding to the determination model that has calculated the abnormality score having the lowest value to the control assistance device 4. The abnormality score having the lowest value indicates the highest normality degree. In the example of FIG. 4, the abnormality score ASn calculated by the determination model MDn has the lowest value. Thus, the determination model number Mn corresponding to the determination model MDn is transmitted from the lowest score determiner 35 to the control assistance device 4.

The control assistance device 4 determines the parameter value PRn corresponding to the determination model number Mn acquired from the information analysis device 3 as a proper parameter value based on the correspondence relationship CR acquired at the time of a training operation. The determined proper parameter value is transmitted from the control assistance device 4 to the substrate processing apparatus 1. In the substrate processing apparatus 1, the parameter value PR1 for the constituent element C1 is updated to the proper parameter value. Similarly, the parameter values PR2 to PRn for the other constituent elements C2 to Cn can be updated.

Figure 7:
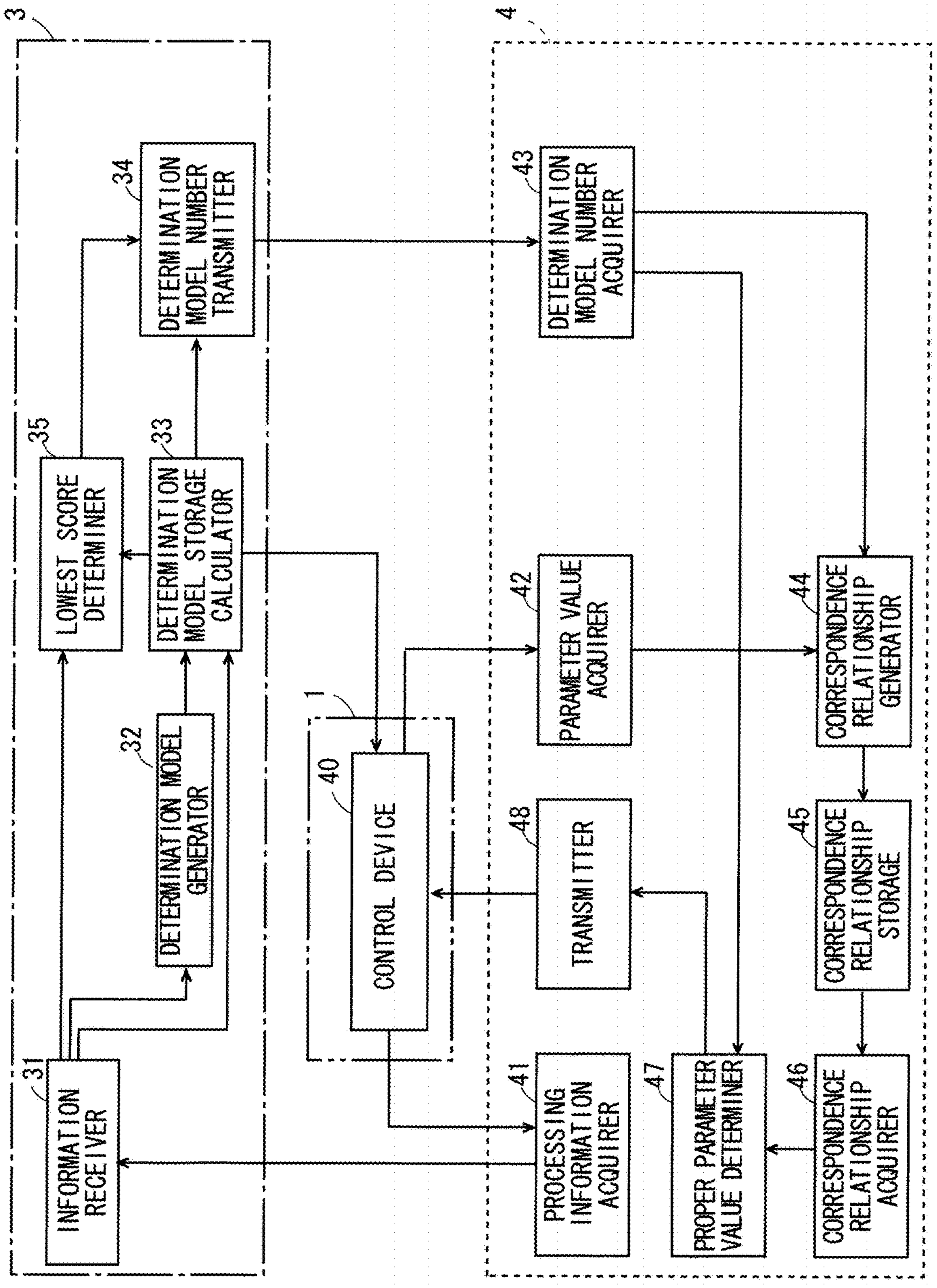
FIG. 7 is a block diagram for mainly explaining the functional configurations of the information analysis device and the control assistance device of FIG. 1.

(8) Functional Configurations of Control Assistance Device 4, and One Example of Training Operation and Proper Parameter Value Updating Operation FIG. 7 is a block diagram for mainly explaining the functional configurations of the information analysis device 3 and the control assistance device 4 of FIG. 1.

In FIG. 7, the substrate processing apparatus 1 includes the control device 40 of FIG. 4. In FIG. 7, the plurality of constituent elements C1 to Cn and the storage ME of FIG. 4 are not shown. The information analysis device 3 of FIG. 7 includes an information receiver 31, a determination model generator 32, a lowest score determiner 35, a determination model storage calculator 33 and a determination model number transmitter 34. The information analysis device 3 includes a CPU (Central Processing Unit) and a memory, for example. The plurality of function units (the information receiver 31, the determination model generator 32, the determination model storage calculator 33, the determination model number transmitter 34 and the lowest score determiner 35) of FIG. 7 are implemented by execution of a control program stored in the memory by the CPU.

The control assistance device 4 of FIG. 7 includes a processing information acquirer 41, a parameter value acquirer 42, a determination model number acquirer 43, a correspondence relationship generator 44, a correspondence relationship storage 45, a correspondence relationship acquirer 46, a proper parameter value determiner 47 and a transmitter 48. The control assistance device 4 includes a CPU (Central Processing Unit) and a memory, for example. The plurality of function units (the processing information acquirer 41, the parameter value acquirer 42, the determination model number acquirer 43, the correspondence relationship generator 44, the correspondence relationship storage 45, the correspondence relationship acquirer 46, the proper parameter value determiner 47 and the transmitter 48) of FIG. 7 are implemented by execution of the control program stored in the memory by the CPU. The function and operation of each of the function units (the information receiver 31, the determination model generator 32, the determination model storage calculator 33, the determination model number transmitter 34 and the lowest score determiner 35, the processing information acquirer 41, the parameter value acquirer 42, the determination model number acquirer 43, the correspondence relationship generator 44, the correspondence relationship storage 45, the correspondence relationship acquirer 46, the proper parameter value determiner 47 and the transmitter 48) of FIG. 7 will be described with reference to the flowcharts of FIGS. 8 to 13, described below.

Figure 8:
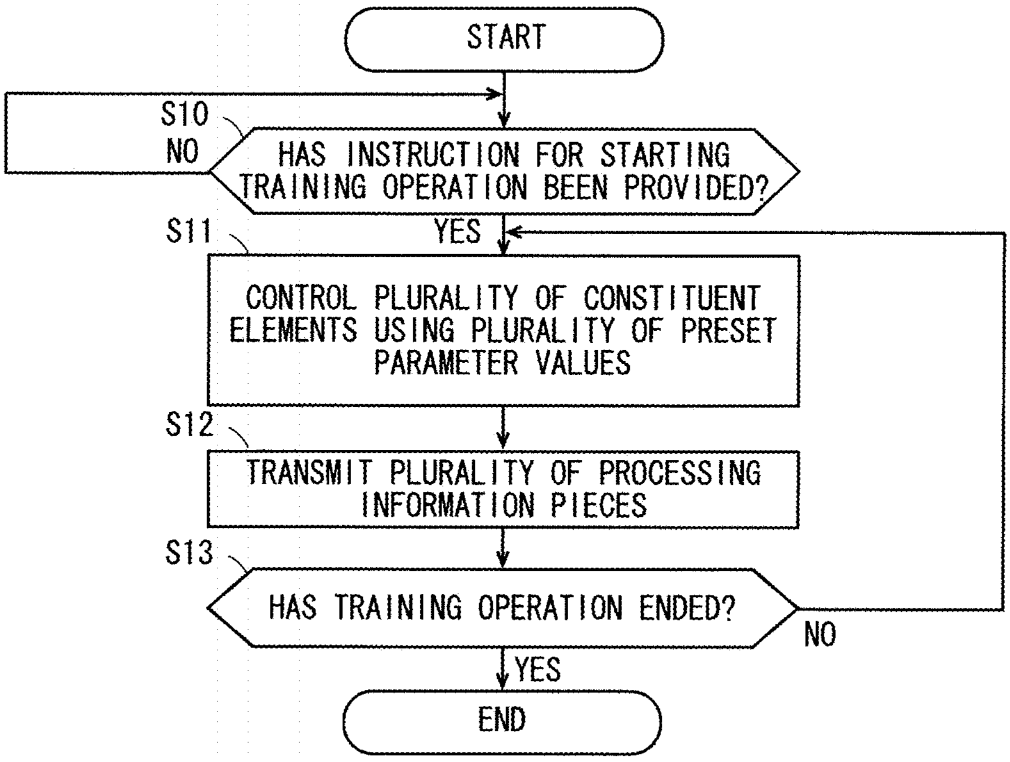
FIG. 8 is a flowchart showing one example of the operation of a control device of the substrate processing apparatus during a training operation.
Figure 9:
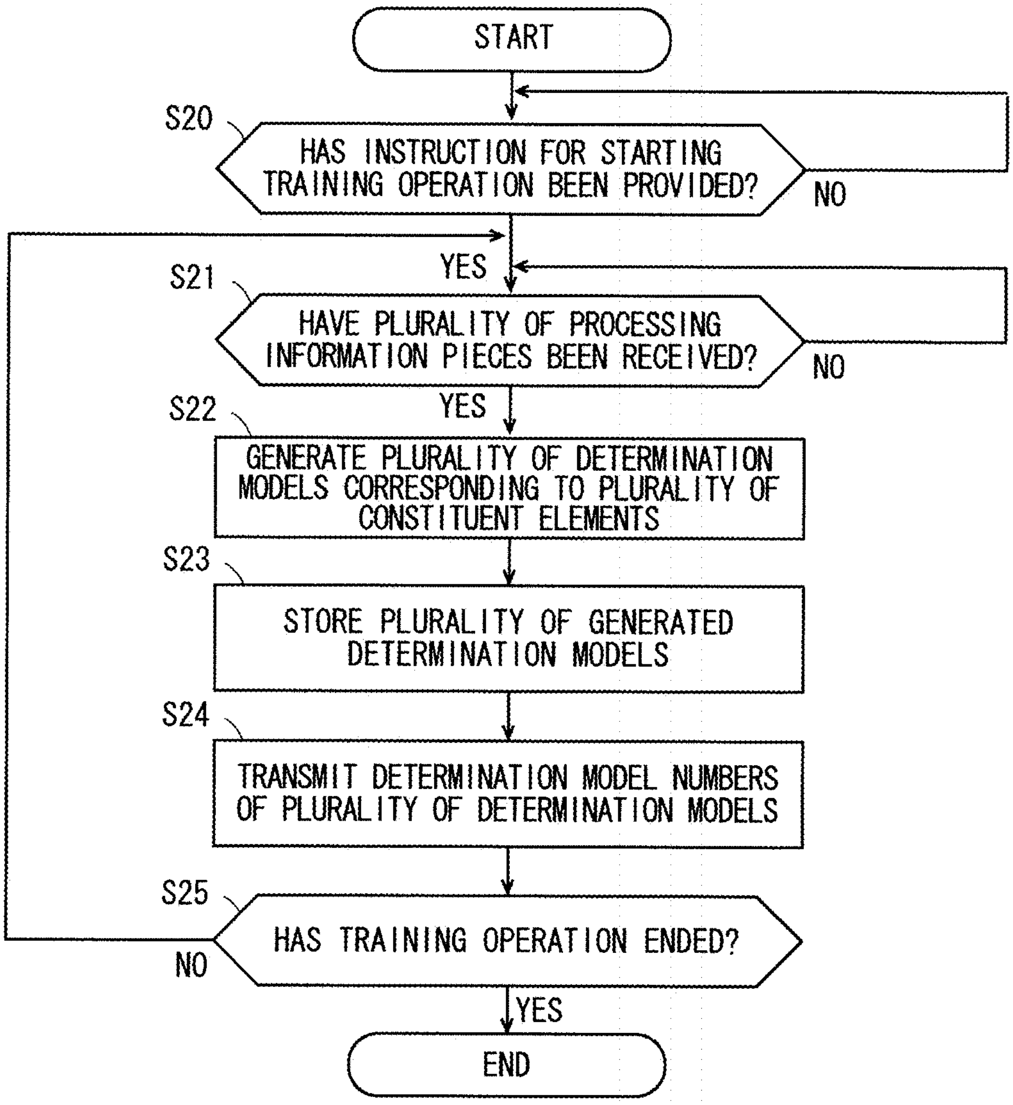
FIG. 9 is a flowchart showing one example of the operation of the information analysis device during the training operation.
Figure 10:
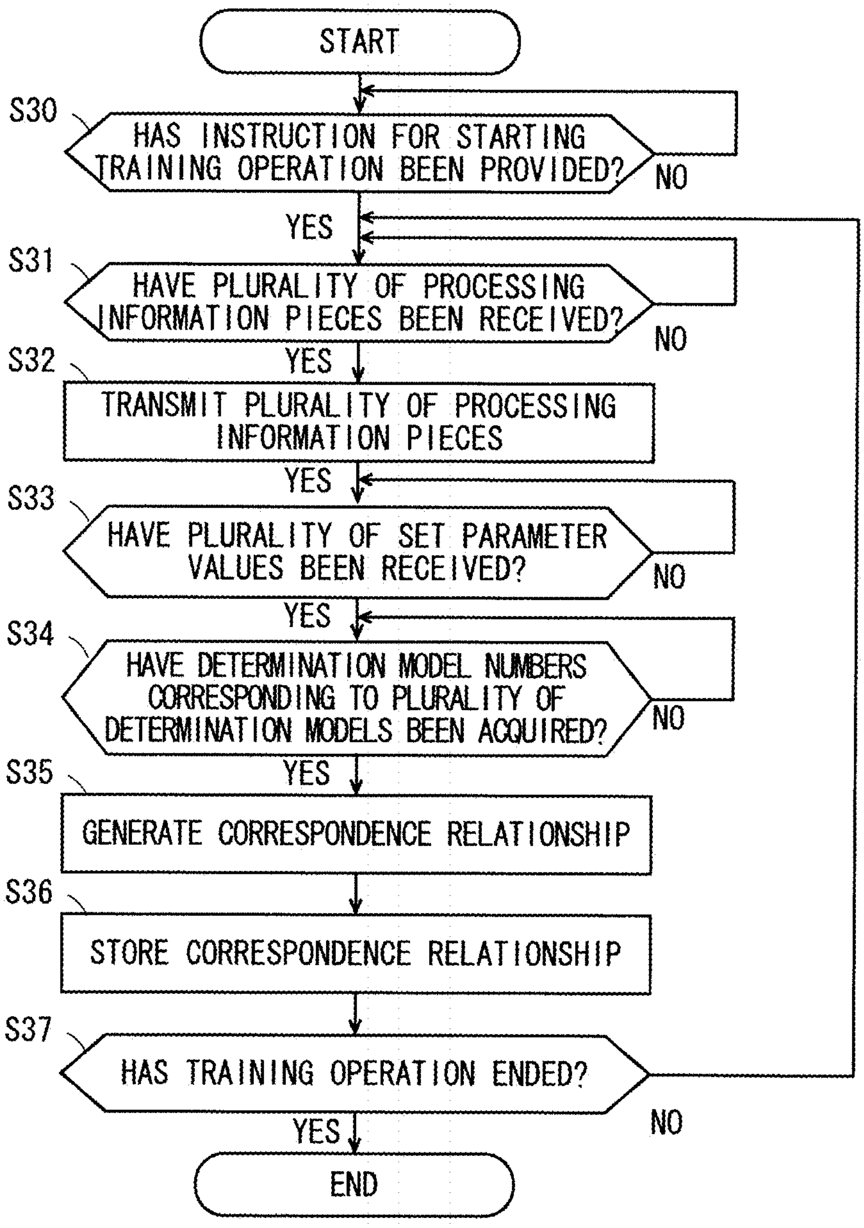
FIG. 10 is a flowchart showing one example of the operation of the control assistance device during the training operation.

FIG. 8 is a flowchart showing one example of the operation of the control device 40 of the substrate processing apparatus 1 during a training operation. FIG. 9 is a flowchart showing one example of the operation of the information analysis device 3 during a training operation. FIG. 10 is a flowchart showing one example of the operation of the control assistance device 4 during a training operation.

First, the training operation performed by the substrate processing apparatus 1, the information analysis device 3 and the control assistance device 4 will be described. In FIG. 8, the control device 40 of the substrate processing apparatus 1 first determines whether an instruction for starting the training operation has been provided (step S10). In a case in which the instruction for starting the training operation has not been provided, the control device 40 waits until the instruction for starting the training operation is provided. In a case in which the instruction for starting the training operation has been provided, the plurality of constituent elements C1 to Cn are controlled using the plurality of preset parameter values PR1 to PRn of FIG. 4 (step S11).

Next, the control device 40 transmits the plurality of processing information pieces PI1 to PIn obtained by the operations of the plurality of constituent elements C1 to Cn to the information analysis device 3 through the control assistance device 4 (step S12). The control device 40 may directly transmit the plurality of obtained processing information pieces PI1 to PIn to the information analysis device 3. Thereafter, the control device 40 determines whether an instruction for ending the training operation has been provided (step S13). In a case in which the instruction for ending the training operation has not been provided, the control device 40 returns to the step S11. Thus, the steps S11 to S13 are repeated. In a case in which the instruction for ending the training operation has been provided in the step S13, the training operation ends.

In FIG. 9, the information receiver 31 of the information analysis device 3 determines whether an instruction for starting the training operation has been provided (step S20). In a case in which the instruction for starting the training operation has not been provided, the information receiver 31 waits until the instruction for starting the training operation is provided. In a case in which the instruction for starting the training operation has been provided, the information receiver determines whether the plurality of processing information pieces PI1 to PIn that are transmitted in the step S12 of FIG. 8 have been received. In a case in which the plurality of processing information pieces PI1 to PIn have not been received, the information receiver 31 waits until the plurality of processing information pieces PI1 to PIn are received.

In a case in which the plurality of processing information pieces PI1 to PIn have been received, the determination model generator 32 generates the plurality of determination models MD1 to MDn corresponding to the plurality of constituent elements C1 to Cn using machine learning (step S22). At this time, the determination model generator 32 assigns the determination model numbers M1 to Mn to the plurality of determination models MD1 to MDn as model identification information pieces for identification of respective determination models. The determination model storage calculator 33 stores the plurality of determination models MD1 to MDn generated by the determination model generator 32 (step S23).

The determination model number transmitter 34 transmits the determination model numbers M1 to Mn of the plurality of determination models MD1 to MDn stored in the determination model storage calculator 33 to the control assistance device 4 (step S24). Thereafter, the information receiver 31 determines whether an instruction for ending the training operation has been provided (step S25). In a case in which the instruction for ending the training operation has not been provided, the information receiver 31 returns to the step S21. Thus, the steps S21 to S25 are repeated.

In this manner, the determination model storage calculator 33 stores the plurality of determination models MD1 to MDn corresponding to the plurality of constituent elements C1 to Cn. In a case in which the instruction for ending the training operation has been provided, the training operation ends.

In FIG. 10, the processing information acquirer 41 of the control assistance device 4 determines whether an instruction for starting the training operation has been provided (step S30). In a case in which the instruction for starting the training operation has not been provided, the processing information acquirer 41 waits until the instruction for starting the training operation is provided. In a case in which the instruction for starting the training operation has been provided, the processing information acquirer 41 determines whether the plurality of processing information pieces PI1 to PIn have been received (step S31). In a case in which the plurality of processing information pieces PI1 to PIn have not been received, the processing information acquirer 41 waits until the plurality of processing information pieces PI1 to PIn are received.

In a case in which the plurality of processing information pieces PI1 to PIn have been received, the processing information acquirer 41 transmits the plurality of received processing information pieces PI1 to PIn to the information analysis device 3 (step S32). In a case in which the substrate processing apparatus 1 directly transmits the plurality of processing information pieces PI1 to PIn to the information analysis device 3, the processing information acquirer 41 does not perform the step S31 or S32.

The parameter value acquirer 42 determines whether the plurality of parameter values PR1 to PRn set to control the constituent elements in the substrate processing apparatus 1 have been acquired (step S33). In a case in which the plurality of set parameter values PR1 to PRn have not been acquired, the parameter value acquirer 42 waits until the plurality of set parameter values PR1 to PRn are acquired.

Further, the determination model number acquirer 43 determines whether the plurality of determination model numbers M1 to Mn transmitted by the information analysis device 3 have been acquired (step S34). In a case in which the plurality of determination model numbers M1 to Mn have not been acquired, the determination model number acquirer 43 waits until the plurality of determination model numbers M1 to Mn are acquired.

In a case in which the determination model number acquirer 43 have acquired the plurality of determination model numbers M1 to Mn, the correspondence relationship generator 44 generates the correspondence relationship CR between the plurality of parameter values PR1 to PRn acquired by the parameter value acquirer 42 and the plurality of determination model numbers M1 to Mn acquired by the determination model number acquirer 43 (step S35). The correspondence relationship storage 45 stores the correspondence relationship CR generated by the correspondence relationship generator 44 (step S36).

The processing information acquirer 41 determines whether an instruction for ending the training operation has been provided (step S37). In a case in which the instruction for ending the training operation has not been provided, the process returns to the step S31. Thus, the steps S31 to S37 are repeated. In a case in which the instruction for ending the training operation has been provided, the training operation ends.

Figure 11:
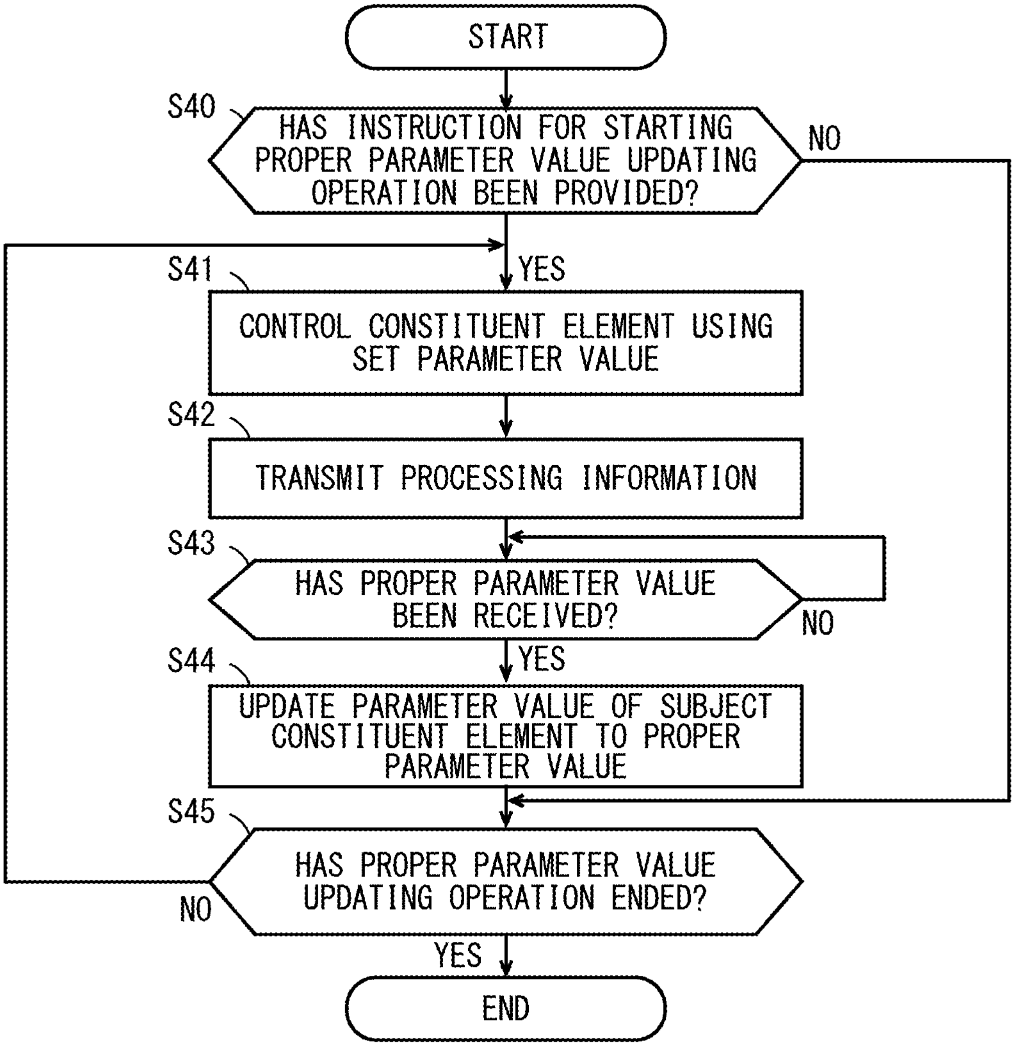
FIG. 11 is a flowchart showing one example of the operation of the substrate processing apparatus in a proper parameter value updating operation.
Figure 12:
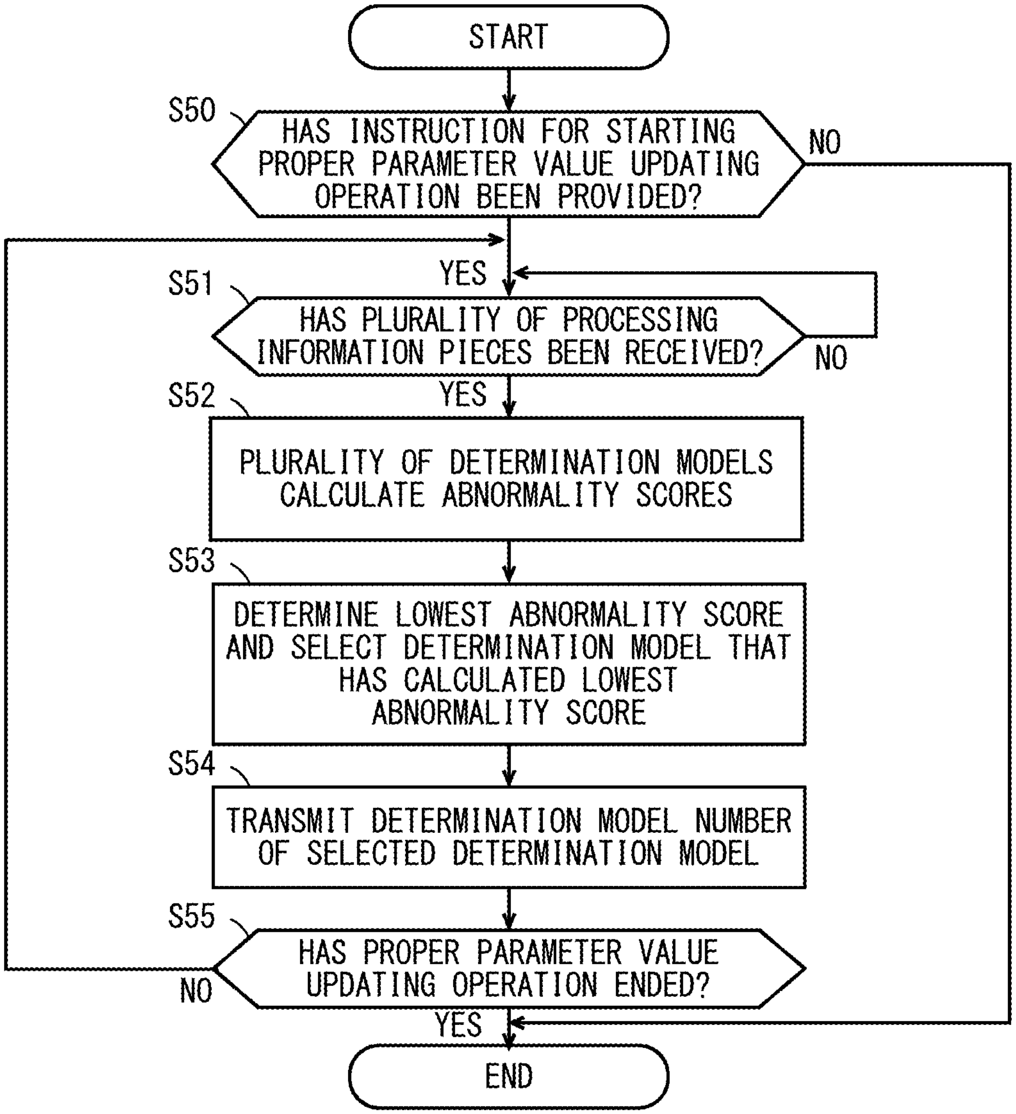
FIG. 12 is a flowchart showing one example of the operation of the information analysis device in the proper parameter value updating operation.
Figure 13:
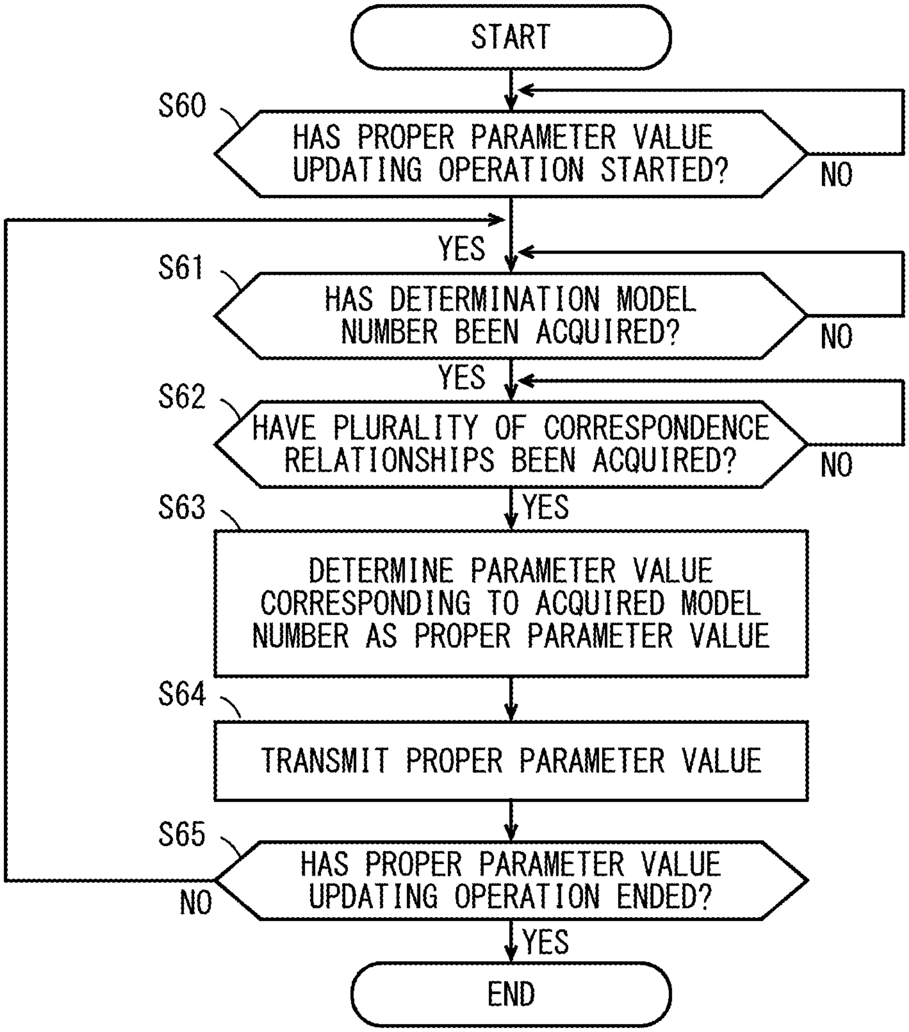
FIG. 13 is a flowchart showing one example of the operation of the control assistance device in the proper parameter value updating operation.

FIG. 11 is a flowchart showing one example of the operation of the substrate processing apparatus 1 in the proper parameter value updating operation. FIG. 12 is a flowchart showing one example of the operation of the information analysis device 3 in the proper parameter value updating operation. FIG. 13 is a flowchart showing one example of the operation of the control assistance device 4 in the proper parameter value updating operation.

Subsequently, the proper parameter value updating operation performed by the substrate processing apparatus 1, the information analysis device 3 and the control assistance device 4 will be described. Hereinafter, a parameter value to be updated is denoted by PRK, and a constituent element to be updated is denoted by Ck. K is any integer of 1 to n.

In FIG. 11, the control device 40 of the substrate processing apparatus 1 determines whether an instruction for starting the proper parameter value updating operation has been provided (step S40). In a case in which the instruction for starting the proper parameter value updating operation has not been provided, the control device 40 waits until the instruction for starting the proper parameter value updating operation is provided. In a case in which the instruction for starting the proper parameter value updating operation has been provided, the control device 40 controls the constituent element Ck using the preset parameter value Pk (step S41).

Next, the control device 40 transmits a processing information piece Plk obtained by the operation performed by the constituent element Ck to the information analysis device 3 through the control assistance device 4 (step S42). The control device 40 may directly transmit the obtained processing information piece Plk to the information analysis device 3. Thereafter, the control device 40 determines whether a proper parameter value transmitted by the transmitter 48 of the control assistance device 4 has been received in the step S64, described below (step S43). In a case in which the proper parameter value has not been received, the control device 40 waits until the proper parameter value is received.

In a case in which the proper parameter value has been received, the control device 40 updates the parameter value Pk of the subject constituent element Ck to the proper parameter value (step S44). The control device 40 determines whether an instruction for ending the proper parameter value updating operation has been provided (step S45). In a case in which the instruction for ending the proper parameter value updating operation has not been provided, the control device 40 returns to the step S41. In a case in which the instruction for ending the proper parameter value updating operation has been provided, the proper parameter value updating operation ends.

In FIG. 12, the information receiver 31 of the information analysis device 3 determines whether an instruction for starting the proper parameter value updating operation has been provided (step S50). In a case in which the instruction for starting the proper parameter value updating operation has not been provided, the information receiver 31 waits until the instruction for starting the proper parameter value updating operation is provided. In a case in which the instruction for starting the proper parameter value updating operation has been provided, the information receiver 31 determines whether the processing information piece PIk that has been transmitted by the control device 40 through the control assistance device 4 in the step S42 of FIG. 11 has been received (step S51).

In a case in which the processing information piece PIk has not been received, the information receiver 31 waits until the processing information piece PIk is received. In a case in which the processing information piece PIk has been received, the plurality of determination models MD1 to MDn stored in the determination model storage calculator 33 respectively calculate the abnormality scores AS1 to ASn based on the received processing information piece PIk (step S52). The lowest score determiner 35 determines the lowest abnormality score among the plurality of abnormality scores AS1 to ASn, and selects the determination model that has calculated the lowest abnormality score (step S53).

The determination model number transmitter 34 transmits the determination model number of the selected determination model to the control assistance device 4 (step S54). Therefore, the information receiver 31 determines whether an instruction for ending the proper parameter value updating operation has been provided (step S55). In a case in which the instruction for ending the proper parameter value updating operation has not been provided, the process returns to the step S51. In a case in which the instruction for ending the proper parameter value updating operation has been provided, the proper parameter value updating operation ends.

In FIG. 13, the processing information acquirer 41 of the control assistance device 4 determines whether an instruction for starting the proper parameter value updating operation has been provided (step S60). In a case in which the instruction for starting the proper parameter value updating operation has not been provided, the processing information acquirer 41 waits until the instruction for starting the proper parameter value updating operation is provided. In a case in which the instruction for starting the proper parameter value updating operation has been provided, the determination model number acquirer 43 determines whether the determination model number that has been transmitted from the determination model number transmitter 34 of the information analysis device 3 in the step S54 of FIG. 12 has been acquired (step S61). In a case in which the determination model number has not been acquired, the determination model number transmitter 34 waits until the determination model number is acquired. In a case in which the determination model number has been acquired, the correspondence relationship acquirer 46 acquires the correspondence relationship CR stored in the correspondence relationship storage 45 (step S62). The proper parameter value determiner 47 determines the parameter value corresponding to the determination model number acquired by the determination model number acquirer 43 as a proper parameter value based on the correspondence relationship CR acquired by the correspondence relationship acquirer 46 (step S63). The transmitter 48 transmits the proper parameter value determined by the proper parameter value determiner 47 to the substrate processing apparatus 1 (step S64). The processing information acquirer 41 determines whether an instruction for ending the proper parameter value updating operation has been provided (step S65). In a case in which the instruction for ending the proper parameter value updating operation has not been provided, the process returns to the step S61. In a case in which the instruction for ending the proper parameter updating operation has been provided, the proper parameter value updating operation ends.

In this manner, the parameter value CRk for control of at least the one constituent element Ck is updated to an appropriate parameter value by the proper parameter value updating operation. Also in regard to other parameter values, the plurality of parameter values PR1 to PRn can be updated (finely adjusted) to appropriate parameter values by the similar proper parameter value updating operation.

Note that, in a case in which a parameter value for control of at least one constituent element is updated, because the operation of the constituent element is controlled using the updated parameter value, the information analysis device 3 generates a determination model corresponding to the updated parameter value by performing the above-mentioned training operation.

In this case, the determination model storage calculator 33 of the information analysis device 3 stores a new determination model in addition to the determination model corresponding to the parameter value before the update. This increases the number of determination models for calculating abnormality scores when the proper parameter value updating operation is performed. Thus, the proper parameter value updating operation is repeatedly performed, so that the accuracy of the proper parameter value is improved.

(9) Effects of Embodiments

With the control assistance device 4 according to the above-mentioned embodiment, it is possible to determine a determination model (the determination model MDn in the example of FIG. 4) that can obtain a proper determination result based on a determination model number (the determination model number Mn in the example of FIG. 4) acquired from the information analysis device 3 by the proper parameter value updating operation. Further, based on the correspondence relationship CR, it is possible to determine a parameter value (the parameter value PRn in the example of FIG. 4) corresponding to the determined determination model (the determination model MDn in the example of FIG. 4). Thus, a parameter value (the parameter value PRn in the example of FIG. 4) is determined based on the acquired correspondence relationship CR and the acquired determination model number (the determination model number Mn in the example of FIG. 4). Therefore, an appropriate parameter value (the parameter value PRn in the example of FIG. 4) for control of a constituent element (the constituent element C1 in the example of FIG. 4) in the substrate processing apparatus 1 is automatically determined. Similarly, appropriate parameter values for control of the other constituent elements (the constituent elements C2 to Cn in the example of FIG. 4) can be automatically determined. As a result, it is possible to reduce the labor for determining an appropriate value of the control parameter of a constituent element of the gas supply-exhaust system AES of the substrate processing apparatus 1.

Further, in the present embodiment, the information analysis device 3 appropriately determines abnormality degrees (normality degree) of the operation of each of the plurality of constituent elements based on the invariant relationship between processing information pieces of the substrate processing apparatus 1. Thus, a determination model number acquired by the determination model number acquirer 43 of the control assistance device 4 is the determination model number corresponding to a determination model capable of obtaining a more appropriate determination result (an abnormality score having the lowest abnormality degree). Thus, the proper parameter value determiner 47 determines the parameter value corresponding to the determination model number acquired by the determination model number acquirer 43 as a proper parameter value based on the correspondence relationship CR acquired by the correspondence relationship acquirer 46. As a result, it is possible to determine an appropriate parameter value for control of a constituent element of the gas supply-exhaust system of the substrate processing apparatus 1.

Further, in the present embodiment, the control assistance device 4 includes the transmitter 48, so that it is possible to transmit a proper parameter value to the substrate processing apparatus 1. Thus, it is possible to automatically set a parameter value for control of a constituent element of the substrate processing apparatus 1 in the substrate processing apparatus 1.

Further, when the substrate processing apparatus 1 is installed, when the substrate processing apparatus 1 is inspected or when a constituent element is replaced, an appropriate parameter value used for the constituent element after installation, after inspection or after replacement can be determined automatically and in a short period of time.

Further, in the present embodiment, the control assistance device 4 includes the correspondence relationship storage 45, so that it is not necessary to provide a configuration for storing a correspondence relationships outside of the control assistance device 4.

(4) Other Embodiments (10-1) While a determination model is generated based on an invariant relationship in the control assistance device 4 of the above-mentioned embodiment, the present invention is not limited to this. For example, in the control assistance device 4, a determination model may be generated using another machine learning method such as deep learning.

(10-2) While the control assistance device 4 includes the transmitter 48 in the above-mentioned embodiment, the present invention is not limited to this. For example, a notifier for notifying the control assistance device 4 of a proper parameter value determined by the proper parameter value determiner 47 may be provided. In this case, a worker can input a proper parameter value, that has been provided to the notifier, to the substrate processing apparatus 1.

(10-3) While the control assistance device 4 includes the correspondence relationship storage 45 in the above-mentioned embodiment, the present invention is not limited to this. A configuration for storage of correspondence relationships may be provided outside of the control assistance device 4. For example, a correspondence relationship may be stored in a cloud on the Internet or the like. In this case, the capacity of the storage device of the control assistance device 4 can be reduced.

(10-4) While the substrate processing apparatus 1 and the control assistance device 4 are provided separately in the above-mentioned embodiment, the substrate processing apparatus 1 and the control assistance device 4 may be provided integrally. While the information analysis device 3 and the control assistance device 4 are provided separately in the above-mentioned embodiment, the information analysis device 3 and the control assistance device 4 may be provided integrally.

(11) Reference Embodiment

While the control assistance device 4 according to the above-mentioned embodiment is used to determine a proper parameter value of the gas supplier FFU of the gas supply-exhaust system AES among the various constituent elements of the substrate processing apparatus 1, it is possible to use the control assistance device 4 according to the above-mentioned embodiment in order to determine proper parameter values for the other constituent elements of the substrate processing apparatus 1. For example, the control assistance device 4 according to the above-mentioned embodiment may be used to determine a proper parameter value of each flow-rate adjustment valve of a substrate processing unit WU among the various constituent elements of the substrate processing apparatus 1.

Figure 14:
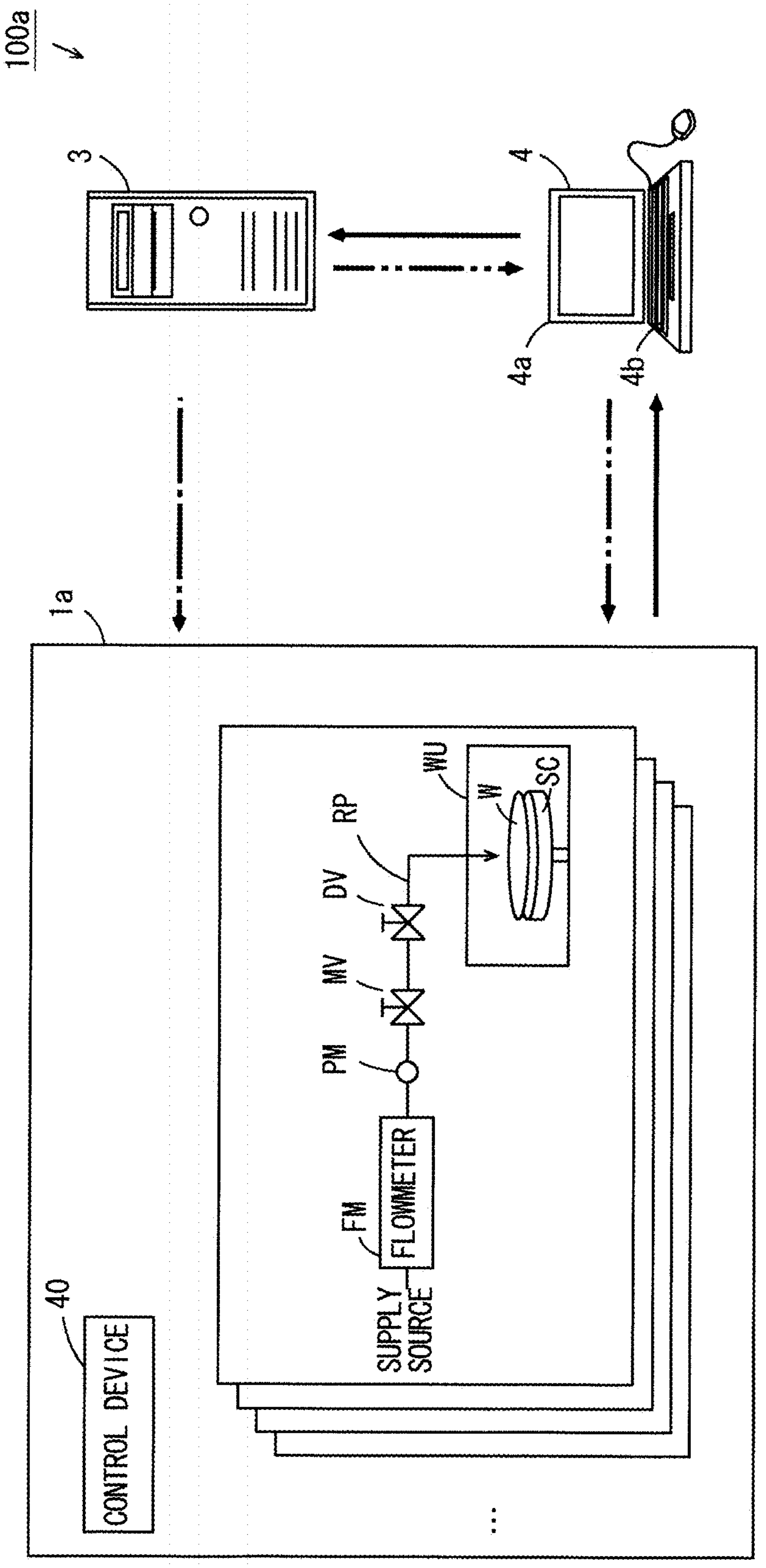
FIG. 14 is a schematic diagram for explaining a substrate processing system including a substrate processing apparatus according to a reference embodiment.

FIG. 14 is a schematic diagram for explaining a substrate processing system 100*a* including a substrate processing system 100*a* according to another embodiment. As shown in FIG. 14, the substrate processing apparatus 1*a* includes, as constituent elements, a processing liquid flow path RP, a flowmeter FM, a manometer PM, a flow-rate adjustment valve MV and a discharge valve DV in order to supply a processing liquid onto a substrate W held by a spin chuck SC in a substrate processing unit WU. The flowmeter FM measures a value of a flow rate of the processing liquid flowing in the processing liquid flow path RP. The manometer PM measures a value of the pressure in the processing liquid flow path RP. The discharge valve DV performs an opening-closing operation in order to supply the processing liquid in the processing liquid flow path RP to the substrate processing unit WU. The flow-rate adjustment valve MV is a motor needle valve. The flow-rate adjustment valve MV includes a motor and a needle, and the needle is moved by the motor in the inner flow path, thereby adjusting a flow rate.

The control device 40 controls the electric power supplied to the motor of the flow-rate adjustment valve MV based on a flow rate of the processing liquid flowing in the processing liquid flow path RP detected by the flowmeter FM.

In the above-mentioned substrate processing apparatus 1*a*, a proper parameter value for control of the flow-rate adjustment valve MV can be determined by the proper parameter value updating operation performed by the information analysis device 3 and the control assistance device 4 in the above-mentioned embodiment.

While the proper parameter value updating operation is performed to update (finely adjust) a parameter value for each constituent element at the time of installation of the substrate processing apparatus 1 or at the time of inspection of the substrate processing apparatus 1, or to update (finely adjust) a parameter value at the time of replacement of any constituent element of the substrate processing apparatus 1, the present invention is not limited to this. For example, the proper parameter value updating operation may be performed in a case in which an abnormality is detected in any of the plurality of constituent elements by the information analysis device 3. In this case, a parameter value of a constituent element in which an abnormality has been detected is updated to a proper parameter value. Thus, in a case in which no abnormality is detected in regard to a constituent element controlled with an updated proper parameter value, the constituent element can be continuously used without being replaced with a new constituent element.

For example, in a case in which a motor needle valve is used as the flow-rate adjustment valve MV of the substrate processing apparatus 1*a*, it is assumed that an abnormality of the motor needle valve caused by a change in shape of the needle due to deterioration over time has been detected. In this case, with the control assistance device 4 according to the above-mentioned embodiment, a parameter value for the motor needle valve in which an abnormality has been detected can be updated to a proper parameter value. In a case in which no abnormality of the motor needle is detected with the motor needle controlled with a proper parameter value, it is possible to continue to use the motor needle. As a result, the remaining service life of the motor needle can be prolonged.

(12) Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. In the above-mentioned embodiment, the determination model number acquirer 43 is an example of an information acquirer, the correspondence relationship storage 45 is an example of a storage, and the proper parameter value determiner 47 is an example of a determiner.

The invention claimed is:

1. A control assistance device that determines a parameter value which is a value of a control parameter for control of a constituent element in a gas supply-exhaust system of a substrate processing apparatus, comprising:

a correspondence relationship acquirer that acquires a correspondence relationship between a plurality of model identification information pieces for identification of a plurality of respective determination models that respectively determine normality degrees of operations of the constituent element based on processing information pieces representing operations or states relating to a process executed on a substrate by the substrate processing apparatus, and a plurality of parameter values;

an information acquirer that acquires a model identification information piece corresponding to a determination model, among the plurality of determination models, that is configured to obtain a proper determination result based on processing information pieces during an operation of the constituent element; and a determiner that determines the parameter value for control of the constituent element based on the correspondence relationship acquired by the correspondence relationship acquirer and the model identification information piece acquired by the information acquirer.

2. The control assistance device according to claim 1, wherein the information acquirer acquires a model identification information piece of a determination model corresponding to a determination result indicating a highest normality degree among a plurality of determination results of the plurality of determination models.

3. The control assistance device according to claim 1, wherein the substrate processing apparatus includes a plurality of constituent elements of a same type as the constituent elements, the plurality of parameter values are respective values for control of the plurality of respective constituent elements, and the determiner determines the parameter value for control of each constituent element based on the correspondence relationship acquired by the correspondence relationship acquirer and the model identification information piece acquired by the information acquirer.

4. The control assistance device according to claim 1, further comprising a transmitter that transmits the parameter value determined by the determiner to the substrate processing apparatus.

5. The control assistance device according to claim 1, wherein the determiner, when the substrate processing apparatus is installed, when the substrate processing apparatus is inspected, or in a case in which a constituent element of the substrate processing apparatus is replaced with a new constituent element, determines the parameter value used for control of a constituent element after the installation or after the replacement.

6. The control assistance device according to claim 1, wherein during a normal operation of the substrate processing apparatus, in a case in which a determination result of a determination model corresponding to the parameter value used for control of the constituent element indicates a predetermined abnormality state, the correspondence relationship acquirer acquires the correspondence relationship, the information acquirer acquires a model identification information piece corresponding to a determination model capable of obtaining the proper determination result, and the determiner, based on the correspondence relationship acquired by the correspondence relationship acquirer and the model identification information piece acquired by the information acquirer, determines the parameter value to be newly used for control of the constituent element.

7. The control assistance device according to claim 1, wherein each of the plurality of determination models, based on invariant relationships in regard to the plurality of processing information pieces representing operations or states relating to a process executed on a substrate by the substrate processing apparatus and a plurality of processing information pieces that have been actually collected from the substrate processing apparatus, determines a normality degree of the constituent element.

8. The control assistance device according to claim 1, further comprising a storage that stores the correspondence relationship, wherein the correspondence relationship acquirer acquires the correspondence relationship stored by the storage, and the determiner determines the parameter value for control of the constituent element using the correspondence relationship stored in the correspondence relationship acquirer.

9. The control assistance device according claim 1, wherein the substrate processing apparatus includes a chamber in which a process is executed on a substrate, the constituent element includes a gas supplier that supplies gas to the chamber, and a gas exhauster that exhausts gas from the chamber, and the parameter value is a value relating to an operation of one of the gas supplier and the gas exhauster.

10. The control assistance device according to claim 9, wherein the control parameter includes a first parameter corresponding to the gas supplier and a second parameter corresponding to a gas exhauster, a parameter value of the first parameter is a value relating to an operation of the gas supplier, and a parameter value of the second parameter is a value relating to an operation of the gas exhauster.

11. A control assistance method of determining a parameter value which is a value of a control parameter for control of a constituent element in a gas supply-exhaust system of a substrate processing apparatus, including:

acquiring a correspondence relationship between a plurality of model identification information pieces for identification of a plurality of respective determination models that respectively determine normality degrees of operations of the constituent element based on processing information pieces representing operations or states relating to a process executed on a substrate by the substrate processing apparatus, and a plurality of parameter values;

acquiring a model identification information piece corresponding to a determination model, among the plurality of determination models, that is configured to obtain a proper determination result based on processing information pieces during an operation of the constituent element; and determining the parameter value for control of the constituent element based on the acquired correspondence relationship and the acquired model identification information piece.

* * * * *